(12) United States Patent
Butterfield et al.

(10) Patent No.: US 6,645,050 B1
(45) Date of Patent: Nov. 11, 2003

(54) MULTIMODE SUBSTRATE CARRIER

(75) Inventors: Paul D. Butterfield, San Jose, CA (US); Phillip R. Sommer, Newark, CA (US)

(73) Assignee: Applied Materials, Inc., Santa Clara, CA (US)

( * ) Notice: Subject to any disclaimer, the term of this patent is extended or adjusted under 35 U.S.C. 154(b) by 199 days.

(21) Appl. No.: 09/718,050

(22) Filed: Nov. 20, 2000

Related U.S. Application Data

(63) Continuation-in-part of application No. 09/258,042, filed on Feb. 25, 1999.
(60) Provisional application No. 60/185,778, filed on Feb. 29, 2000.

(51) Int. Cl.$^7$ ............................................. B24B 1/00
(52) U.S. Cl. ......................... 451/41; 451/287; 451/388
(58) Field of Search ........................... 451/41, 285–290, 451/388

(56) References Cited

U.S. PATENT DOCUMENTS

| | | | | |
|---|---|---|---|---|
| 5,193,316 A | * | 3/1993 | Olmstead ...................... 51/281 |
| 5,651,724 A | * | 7/1997 | Kimura et al. ................. 451/41 |
| 5,670,011 A | * | 9/1997 | Togawa et al. ............. 156/345 |
| 5,762,539 A | | 6/1998 | Nakashiba et al. ........... 451/41 |
| 5,795,215 A | | 8/1998 | Guthrie et al. .............. 451/286 |
| 5,803,799 A | * | 9/1998 | Volodarsky et al. ........ 451/288 |
| 5,857,899 A | * | 1/1999 | Volodarsky et al. .......... 451/72 |
| 5,868,896 A | | 2/1999 | Robinson et al. ........... 156/344 |
| 5,885,135 A | | 3/1999 | Desorcie et al. .............. 451/41 |
| 5,906,532 A | | 5/1999 | Nakajima et al. ............. 451/41 |
| 5,913,714 A | * | 6/1999 | Volodarsky et al. .......... 451/41 |
| 5,964,646 A | | 10/1999 | Kassir et al. .................. 451/41 |
| 6,004,193 A | | 12/1999 | Nagahara et al. ........... 451/285 |
| 6,012,964 A | | 1/2000 | Arai et al. ..................... 451/5 |
| 6,033,292 A | | 3/2000 | Inaba ......................... 451/288 |
| 6,056,632 A | * | 5/2000 | Mitchel et al. ............. 451/288 |
| 6,074,289 A | | 6/2000 | Murakami et al. .......... 451/388 |
| 6,102,788 A | | 8/2000 | Uto .............................. 451/388 |
| 6,113,480 A | | 9/2000 | Hu et al. ..................... 451/289 |
| 6,276,998 B1 | * | 8/2001 | Sommer et al. ............. 451/41 |
| 6,280,308 B1 | * | 8/2001 | Ishikawa et al. ............ 451/388 |
| 6,328,629 B1 | * | 12/2001 | Togawa et al. ................ 451/8 |
| 6,368,969 B1 | * | 4/2002 | Economikos et al. ....... 438/690 |
| 6,422,928 B1 | * | 7/2002 | Nakamura et al. .......... 451/288 |

FOREIGN PATENT DOCUMENTS

| | | | | |
|---|---|---|---|---|
| EP | 0 589 433 B1 | | 3/1994 | ......... B24B/37/04 |
| EP | 0786310 | * | 7/1997 | ......... B24B/37/04 |
| EP | 0 868 975 A1 | | 10/1998 | ......... B24B/37/04 |
| EP | 0 896 858 A1 | | 2/1999 | ......... B24B/37/04 |

* cited by examiner

*Primary Examiner*—M. Rachuba
(74) *Attorney, Agent, or Firm*—Moser, Patterson & Sheridan

(57) ABSTRACT

Generally, a method and apparatus for retaining a substrate is provided. In one embodiment, a carrier for retaining a substrate comprises a carrier plate having a lower surface, at least one first fluid outlet and a second fluid outlet. The first fluid outlet is fluidly coupled to the lower surface of the carrier plate. The second fluid outlet is fluidly coupled to the lower surface of the carrier plate. A first fluid circuit is coupled to the first fluid outlet and is adapted to flow a fluid forms a fluidic layer between the carrier plate and the substrate. A second fluid circuit is coupled to the second fluid outlet and is separate from the first fluid circuit.

19 Claims, 18 Drawing Sheets

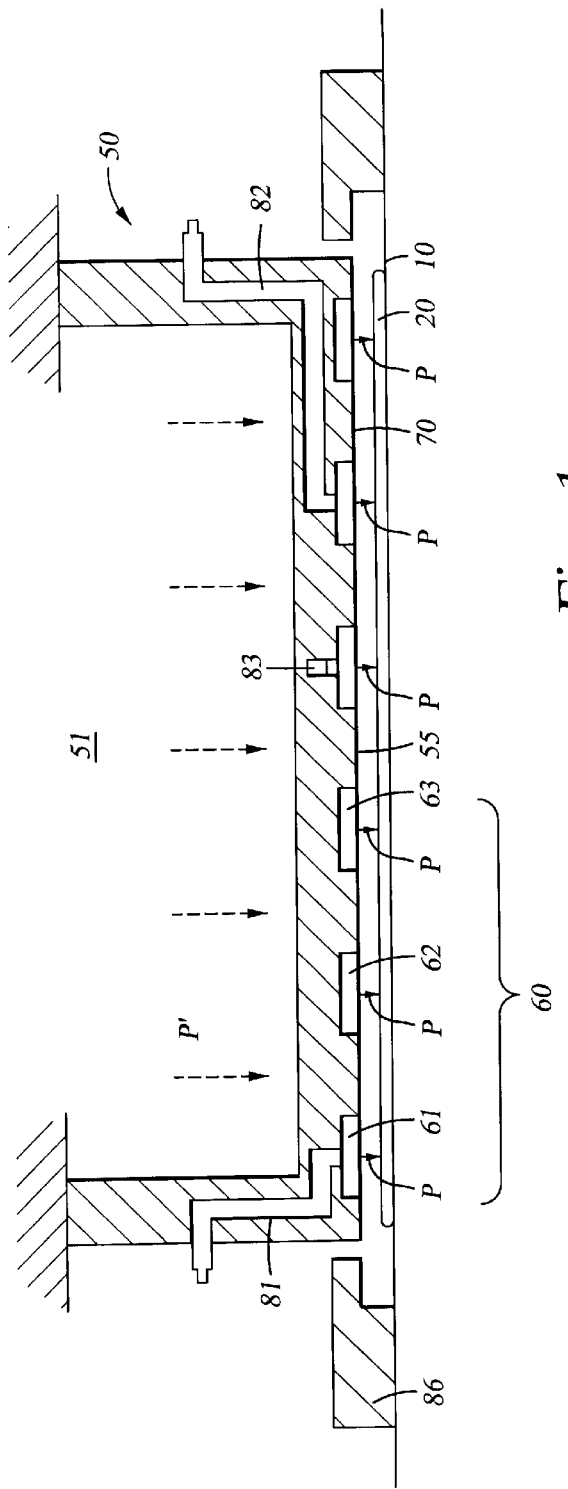
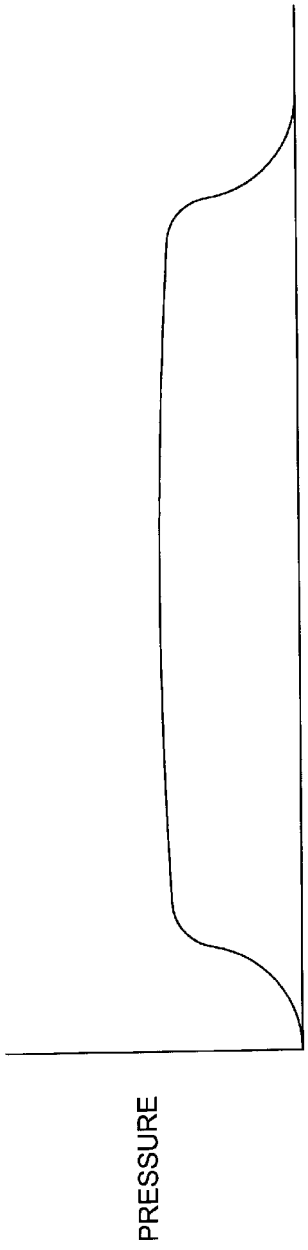

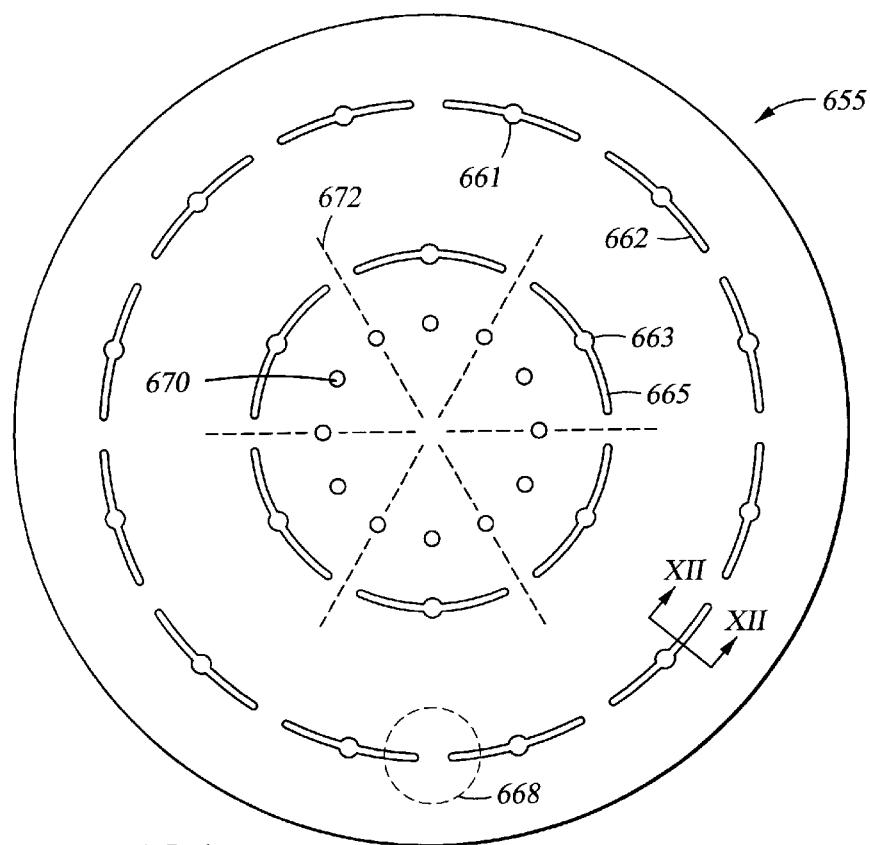
Fig. 12A
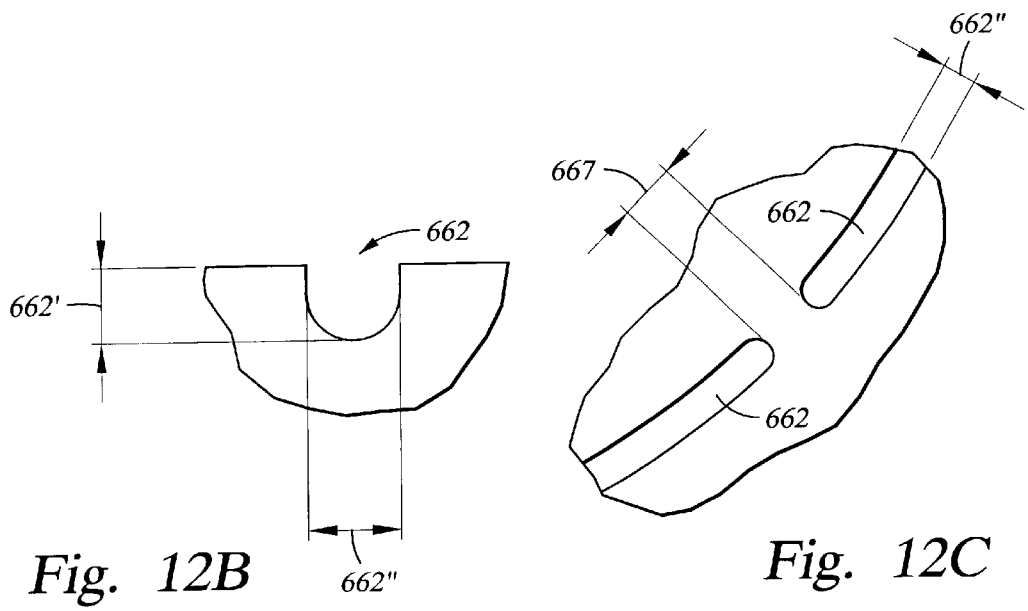
Fig. 12B
Fig. 12C

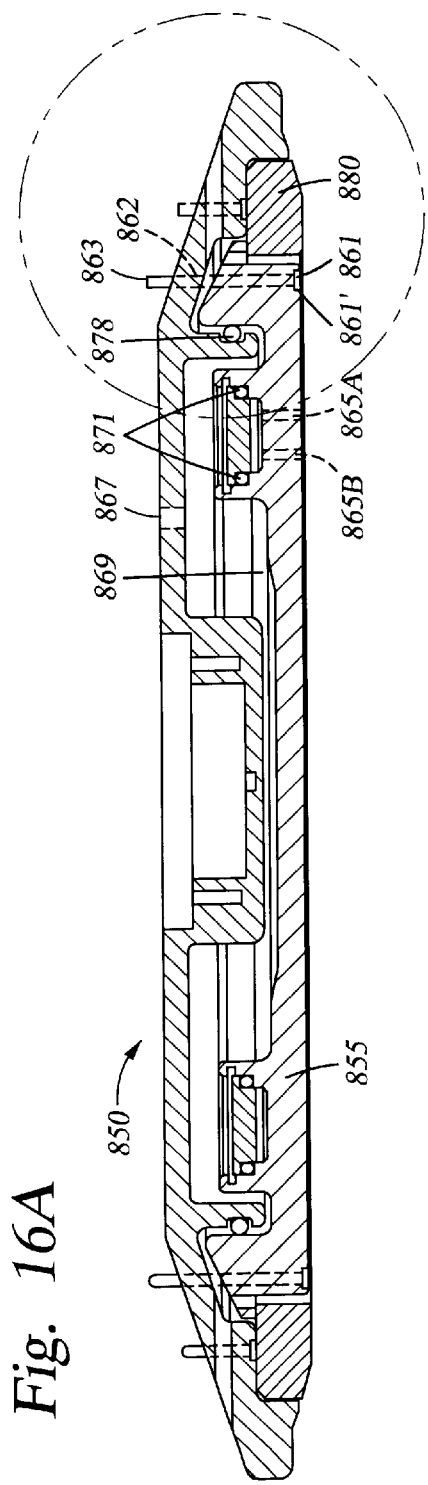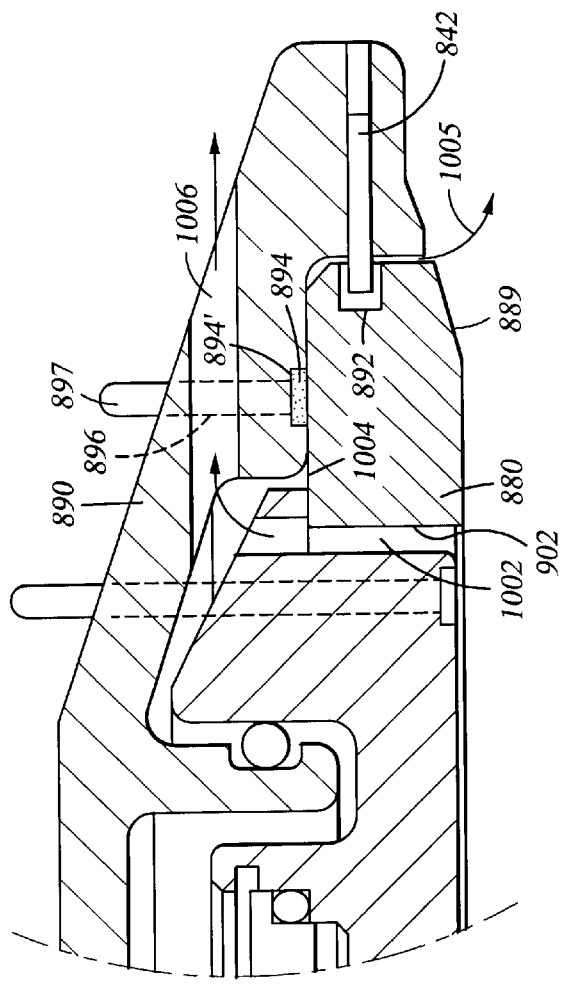
Fig. 16A
Fig. 16B

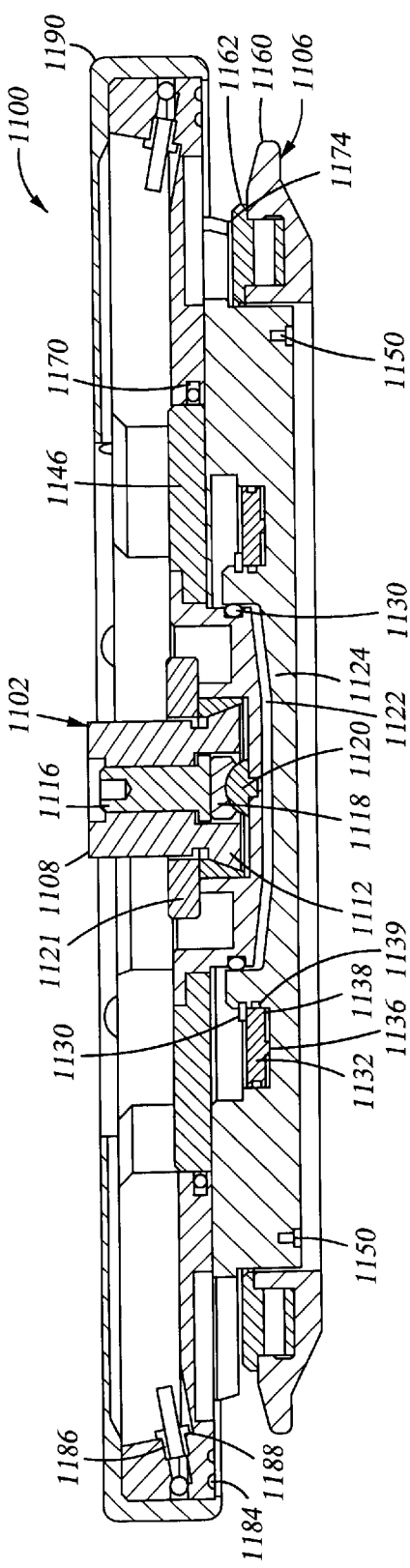
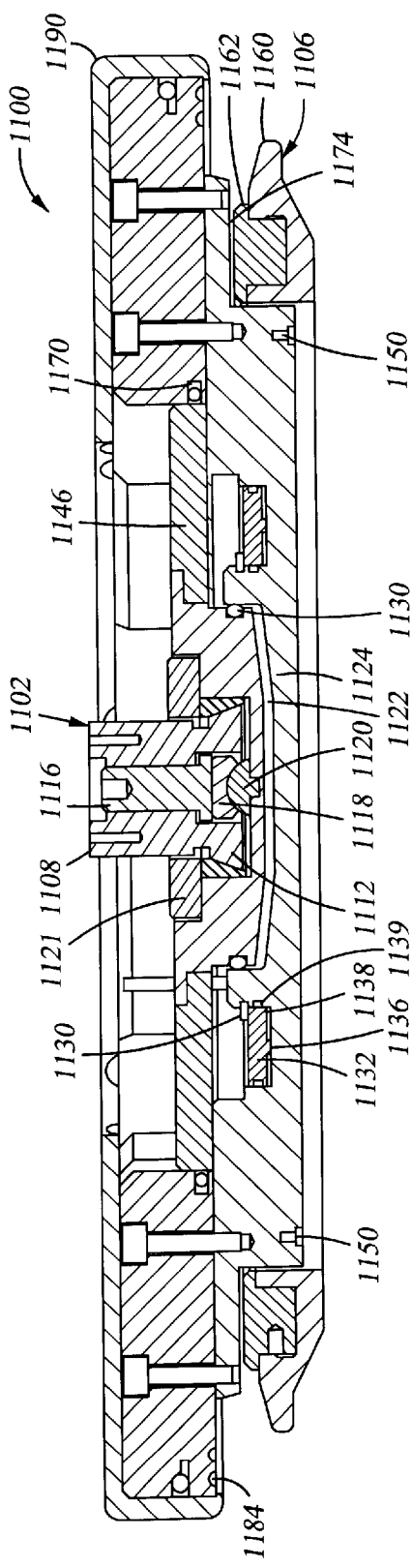
Fig. 19C
Fig. 19D

MULTIMODE SUBSTRATE CARRIER

This application is a continuation-in-part of copending U.S. patent application Ser. No. 09/258,042, filed Feb. 25, 1999 by Sommer et al., which is hereby incorporated by reference herein in its entirety.

This application additionally claims benefit of U.S. Provisional Application Ser. No. 60/185,778, filed Feb. 29, 2000 by Butterfield et al., which is hereby incorporated by reference herein in its entirety.

BACKGROUND OF THE DISCLOSURE

1. Field of Invention

Embodiments of the present invention relate generally to a method and apparatus for retaining a substrate in a polishing system.

2. Background of Invention

As part of the manufacturing process of semiconductor devices, semiconductor wafers are increasingly being polished by CMP. The uniform removal of material from and the planarity of patterned and un-patterned wafers is critical to wafer process yield. Generally, the wafer to be polished is mounted on a substrate carrier which holds the wafer using a combination of vacuum suction or other means and, most often, a wafer backing pad to contact the rear side of the wafer. A retaining lip or ring is generally provided around the edge of the wafer to keep the wafer contained under the substrate carrier. The front side of the wafer, the side to be polished, is then contacted with an abrasive material such as an abrasive pad or abrasive strip. The abrasive pad or strip may have free abrasive fluid sprayed on it, may have abrasive particles affixed to it, or may have abrasive particles sprinkled on it.

The ideal wafer polishing process can be described by Preston's equation:

$$R = K_p * P * V,$$

where R is the removal rate; Kp is a function of consumables (abrasive pad roughness and elasticity, surface chemistry and abrasion effects, and contact area); P is the applied pressure between the wafer and the abrasive pad; and V is the relative velocity between the wafer and the abrasive pad. As a result, the ideal CMP process should have constant cutting velocity over the entire wafer surface, constant pressure between the abrasive pad and wafer, and constant abrasive pad roughness, elasticity, area and abrasion effects. In addition, control over the temperature and pH is critical and the direction of the relative pad/wafer velocity should be randomly distributed over the entire wafer surface.

One common type of wafer polishing apparatus having a wafer carrier is the CMP model 372M made by Westech Systems Inc. A wafer is held in the substrate carrier during polishing. The substrate carrier rotates about the axis of the wafer. A large circular abrasive pad is rotated while contacting the rotating wafer and substrate carrier. The rotating wafer contacts the larger rotating abrasive pad in an area away from the center of the abrasive pad.

Another related apparatus is a polishing machine for polishing semiconductor wafers containing magnetic read-write heads, disclosed in U.S. Pat. No. 5,335,453 to Baldy et al. With this machine, a semiconductor wafer is held by a substrate carrier which is moved in a circular translatory motion by an eccentric arm. The wafer is polished by contacting an abrasive strip that is advanced in one direction. The relative motion between the wafer and the abrasive strip is a combination of the circular motion of the wafer and the linear motion of the advancing abrasive strip. Connected to the eccentric arm is a support head that includes a rigid part and a "flexible disk" made from a "flexible material" having a "certain thickness". The wafer 44 to be polished is described as being "partly embedded in the disk 142 during polishing by the effect of the force exerted on the support head".

The gimbal point of a CMP substrate carrier is a critical element of the polishing process. The substrate carrier must align itself to the polish surface precisely to insure uniform, planar polishing results. Many CMP substrate carriers currently available yield wafers having anomalies in planarity. The vertical height of the pivot point above the polishing surface is also important, since the greater the height, the larger the moment that is induced about the pivot point during polishing. Two pervasive problems that exist in most CMP wafer polishing apparatuses are underpolishing of the center of the wafer, and the inability to adjust the control of wafer edge exclusion as process variables change.

For example, substrate carriers used on many available CMP machines experience a phenomenon known in the art as "nose diving". During polishing, the head reacts to the polishing forces in a manner that creates a sizable moment, which is directly influenced by the height of the gimbal point, mentioned above. This moment causes a pressure differential along the direction of motion of the head. The result of the pressure differential is the formation of a standing wave of the chemical slurry that interfaces the wafer and the abrasive surface. This causes the edge of the wafer that is at the leading edge of the substrate carrier, to become polished faster and to a greater degree than the center of the wafer.

The removal of material on the wafer is related to the chemical action of the slurry. As slurry is inducted between the wafer and the abrasive pad and reacts, the chemicals responsible for removal of the wafer material gradually become exhausted. Thus, the removal of wafer material further from the leading edge of the substrate carrier (i.e., the center of the wafer) experiences a diminished rate of chemical removal when compared with the chemical action at the leading edge of the substrate carrier (i.e., the edge of the wafer), due to the diminished activity of the chemicals in the slurry when it reaches the center of the wafer. This phenomenon is sometimes referred to as "slurry starvation".

Apart from attempts to reshape the crown of the substrate carrier, other attempts have been made to improve the aforementioned problem concerning "nose diving". In a prior art substrate carrier that gimbals through a single bearing at the top of the substrate carrier, sizable moments are generated because the effective gimbal point of the substrate carrier exists at a significant, non-zero distance from the surface of the polishing pad. Thus, the frictional forces, acting at the surface of the polishing pad, act through this distance to create the undesirable moments.

U.S. Pat. No. 5,377,451 to Leoni et al. describes a wafer carrier that "projects" the effective gimbal point down to the surface of the polishing pad, thereby eliminating the moment arm through which the frictional forces create the undesirable "nose diving". Leoni et al. produce this effect by instituting a conical bearing assembly which allows the projection of a "universal pivot point" to a point that is located at or near the surface of the polishing surface. The solution proposed by Leoni et al., however, requires the use of a number of bearings in the assembly in order to effect this projection, thereby increasing the cost of the wafer carrier. Additionally, there is still a moment produced because of the actual contact points at the bearings. There is also a substantial risk that, due to inexact manufacturing, the projected pivot point will not lie exactly on the contact surface of the carrier, which will also introduce moments.

FIG. 17 shows a prior art carrier design 900 that transfers the polishing load from a bellows 910 to a guided shaft 920 into a gimbal 930 (shown in phantom to illustrate the gimbal point 933 and outward into a carrier plate 940. If the gimbal mechanism is not free, stiction will prevent the gimbal 930 from its intended free and smooth movement and the guided shaft 920 will begin to over-constrain the system during polishing.

Additionally, it is not uncommon for loads in this type of a system to become excessive enough to cause plastic deformation of the gimbal. Because of the offset rotation points of the gimbal 930 and the ring flexure 950, the dynamics of such a carrier assembly can become unstable during a high friction polishing operation.

A semiconductor wafer polishing apparatus by Banks in U.S. Pat. No. 4,373,991, uses a plurality of channels 27 to inject pressurized water, preferably slightly greater than 15 psi, between a plate and a wafer to allow free floating of the wafer. However, the carrier of Banks uses a conventional gimbal arrangement and therefore experiences the moment induced anomalies such as nose-diving and crowning, as discussed above.

Another phenomenon that generates anomalies in the edge areas of a substrate that is polished by conventional techniques is due to limitations inherent in a carrier that employs a deformable/conformable crown or plate. For example Applied Materials European Patent Application No. EP 0 774 323 A2 discloses a carrier head having a lower planar surface 9104 and a bow chamber 9102 which is capable of being pressurized so as to bow out the surface 9104, or reduced in pressure to bow in the surface 9104. A bellows cavity 1192 is pressurizable to bias the entire carrier plate 1164, including the surface 9104 toward the polishing surface for loading the substrate to be polished.

FIG. 18 illustrates a problem inherent in a prior art carrier 1100 having a deformable plate 1110. Upon deformation of the plate 1110 by application of pressure thereto, either through increasing the pressure within chamber 1130 or by other means, the deflection of the plate 110 is greater toward the center of the plate than at the edge areas 1120 (as shown in phantom in FIG. 16). This is true even if greater flexibility is afforded at the edge areas through living hinges or other mechanisms to extend the flexibility outward, since the very edge defines a boundary of fixed points that do not deflect.

The plate 1110 deflects according to the typical bending formula (as shown in phantom in FIG. 16) which results in a relative underpolishing of the edges of the wafer.

U.S. Pat. No. 5,635,083 to Breivogel et al., discloses a method and apparatus for chemical mechanical polishing of a substrate having a wafer carrier attached to a steel rotatable drive shaft. The drive shaft is hollow to allow pneumatic pressure to be conveyed into a chamber created above the backside of a wafer to be polished and below the base of the carrier. A wear resistant retaining ring extends from the base of the carrier and surrounds and is in contact with the wafer to be polished. A resilient lip seal is attached just inside the retaining ring and seals with the backside of the wafer to form the chamber together with the base of the carrier. Not only does this arrangement restrict wafer precession because of the seal contact, but there is also always a risk of not forming an adequate seal due to contamination between the seal and the backside of the wafer, by slurry or other contaminants.

An apparatus described in JP 9-225821 to Ebara Corp. includes first, second and third pressure chambers within a top ring that is used to polish a semiconductor wafer. An elastic mat is provided between the top ring and the semiconductor wafer to be polished. The elastic mat and the top ring each have multiple jets that align to connect with the pressure chambers. Three concentrically defined pressure zones are defined on the mat, through which controlled pressures can be applied to the wafer to control the conformation of the pressure profile between the elastic mat and the semiconductor wafer.

Therefore, there is a need for a method and apparatus for retaining a substrate during a polishing process.

SUMMARY OF THE INVENTION

One aspect of the invention generally provides a carrier for retaining of a substrate. In one embodiment, a carrier comprises a carrier plate having a lower surface, at least one first fluid outlet and a second fluid outlet. The first fluid outlet is fluidly coupled to the lower surface of the carrier plate. The second fluid outlet is fluidly coupled to the lower surface of the carrier plate. A first fluid circuit is coupled to the first fluid outlet and is adapted to flow a fluid forms a fluidic layer between the carrier plate and the substrate. A second fluid circuit is coupled to the second fluid outlet and is separate from the first fluid circuit.

In another aspect of the invention, a method for retaining a substrate in a polishing system is provided. In one embodiment, a method for retaining a substrate comprises the steps of disposing the substrate adjacent a carrier plate, flowing a first fluid through a first port disposed on the carrier plate between the substrate and the carrier plate, and applying a second fluid or vacuum through a second port disposed on the carrier plate between the substrate and the carrier plate.

BRIEF DESCRIPTION OF THE DRAWINGS

The teachings of the present invention can be readily understood by considering the following detailed description in conjunction with the accompanying drawings.

FIG. 1 is a sectional view of a first embodiment of a carrier head according to the present invention.

FIG. 2 is a graph of a pressure profile applied to a substrate by the carrier in FIG. 1.

FIG. 12A is a bottom view of another embodiment of a carrier plate 655 according to the present invention.

FIG. 12B is a sectional view of groove 662 taken along section lines XII—XII in FIG. 12A.

FIG. 12C is a magnified view of the portions of grooves 662 outlined at 668 in FIG. 12A.

FIG. 16A is a sectional view of another embodiment of a carrier plate according to the present invention.

FIG. 16B is an enlarged view of the portion of FIG. 16A outlined by line XVI.

FIGS. 19A–19D are schematic views of another embodiment of the carrier at different cross sectional planes across the carrier.

To facilitate understanding, identical reference numerals have been used, where possible, to designate identical elements that are common to the figures.

DETAILED DESCRIPTION

Figure 3:
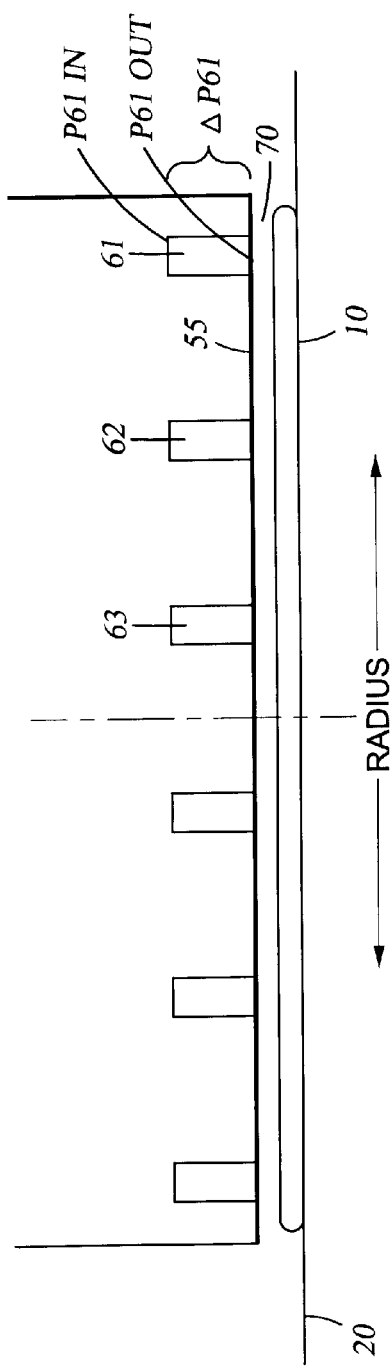
FIG. 3 is a sectional illustration of a carrier applying a varied pressure profile to the back surface of a substrate.

A polishing force against a substrate is generally generated by a load against the backside of a substrate to be polished, in addition to a force applied to drive at least one of the substrate to be polished and the polishing media against which a surface of the substrate is polished. The present invention is directed towards improving the application of the load against the backside of the substrate, to prevent the generation of anomalies, prevalent in current designs, which are due directly to the load application, as well as those that are generated in combination with the driving load.

FIG. 1 schematically shows a partial sectional view of a substrate carrier 50 employing load application principles according to the present invention. The carrier 50 includes force applicator(s) 60 through which a force or forces P are applied to the backside of a substrate 10 to be polished against a polishing media 20. The polishing media may be a slurry or slurryless type of pad or web. Relative movement between the polishing media 20 and substrate 10, in combination with the force applied to the backside of the substrate 10 effects the polishing of the front side of the substrate.

The plate 55 of the substrate carrier 50 forms an upper reference plane from which the force applicator(s) 60 apply the load to the substrate 10. In this example, the force applicators include three concentric rings 61, 62 and 63 that are configured to emit controlled flows of gas and/or liquid. Preferably, the applicators 61, 62 and 63 emit air to form a pressurized air layer 70 between the plate 55 and the substrate 10. However, other gases, water, a mixture of water and air and/or other gases, or vacuum may also be employed in forming a bearing layer 70 between plate 55 and substrate 10. Of course, this type of carrier is not limited to the use of three rings, but may use four rings or more, or even one or two rings. Still further, the entire plate 55 may be formed of a porous material. A greater number of rings give a finer control over the pressure profile that can be applied to the backside of the substrate, but of course, is more complicated and costly to build. On the other hand, two or one ring embodiments are simpler and cheaper, but offer less control and variability of the pressure profile. Optionally, a pressurized chamber 51 may be included above the plate 55 to apply a primary force P' against the at least a portion of the plate 55.

In one embodiment of a three ring arrangement using pressurized air, the "flying height" (i.e., the distance between face 55 and the backside of substrate 10) of the carrier 50 is about 2 to 25 $\mu$m, more preferably about 3 to 10 _m, with preferred flow rates of about 4–6 ft$^3$/hr through ring 61, about 2–2.5 ft$^3$/hr through ring 62 and about 2–4 ft$^3$/hr through ring 63, when the rings are metallic. When the rings are plastic, the preferred flow rates are about 5–100 ft$^3$/hr through ring 61, about 2–10 ft$^3$/hr through ring 62 and about 2–10 ft$^3$/hr through ring 63. By metering or regulating the pressure supplied to the rings, the flying height of the substrate can be tuned or adjusted.

The flow rate through a porous ring or other orifice according to the present invention is substantially inversely proportional to the pressure drop across that ring or other orifice. The pressure drop can be represented by the equation:

$$\_P = P_{in} - P_{out};$$

where _P designates the pressure drop, $P_{in}$ represents the pressure of the gas/fluid inputted to the ring or other orifice, and $P_{out}$ represents the pressure of the gas/fluid outputted from the ring or other orifice.

Thus, a reduction in _P is synonymous with an increase in air flow through which consequently increases the flying height, i.e., the distance between the surface of the carrier 55 and the backside of the substrate 10. An increase in the flying height also lowers the stiffness (K) of the bearing that applies the pressure P to the backside of the substrate 10.

By positioning the restrictor (the outermost ring) close to the edge of the plate, the edge polishing parameters can be adjusted to achieve finer edge exclusion. Of course, the flow rates are adjustable outside of the preferred ranges in order to vary the pressure profile that is applied to the substrate, as will be described below.

The rings are preferably formed by making grooves in the plate 55 and filling the grooves with a microporous material. The rings may be manufactured may be conventionally machined, cast, or formed by wire electric discharge machining (i.e., wire EDM) and are preferably formed by wire EDM. However, other configurations of the pressure applicators are possible and will be discussed in greater detail below. Each ring is independently controllable as to the pressure/flow of gas/liquid emitted therefrom. Supply tubes 81, 82 and 83 are connected to the respective rings 61, 62 and 63 and each leads externally of the carrier 50 and connects with a controllable air/liquid supply (not shown) which may be manually or computer controlled.

When the rings 61, 62 and 63 are set to deliver an equal flow rate/pressure of air/liquid, a constant pressure profile is formed in the layer between the face 55 and backside of the substrate 10, as shown in FIG. 2. Additionally, the outermost ring 61 can be formed very close to the edge of the faceplate 55 to enable the pressure wave to extend at a substantially constant value nearly to the edge of the faceplate. The bearing layer 70 further enables the substrate to "float" or precess with respect to the faceplate 55, since the faceplate 55 does not contact the backside of the substrate once the layer 70 has been formed. The radius of the substrate 10 is somewhat smaller than that of the faceplate, and the substrate is maintained in position between the faceplate 55 and the polishing media 20 by the presence of containment ring 80.

The combination of the ability to apply substantially uniform load pressure over the entire surface of the backside of the substrate with the ability to allow the substrate to precess or float within the confines of the containment ring results in a very uniform polishing process that removes material consistently from the edge of the substrate to the center. At this time, it should be mentioned that the faceplate and containment ring, although preferably circular, are not to be limited to such a shape. For example, the faceplate and containment ring could be formed to have oval, elliptical or various other conforming shapes. Nor do the rings need to be circular, as exemplified in the embodiment shown in FIG. 12B and described below, for example.

Figure 4:
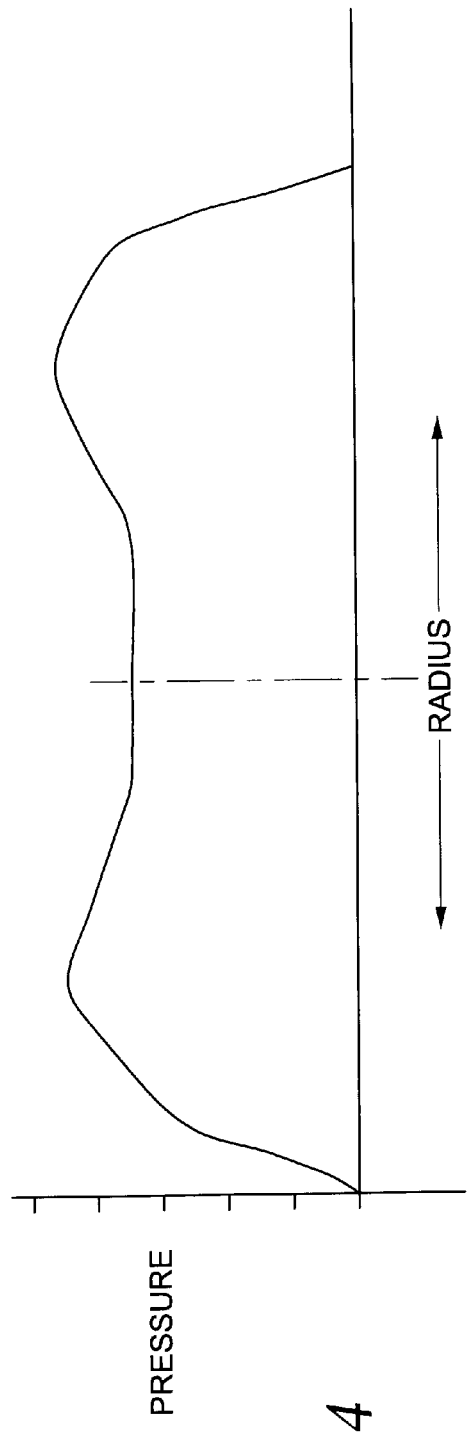
FIG. 4 is a graph of the resultant pressure profile applied to the substrate by the carrier in FIG. 3.

Alternatively, in situations where shaping or conformation of the pressure profile is required, the flow through the rings 61, 62 and 63 can be varied to achieve the desired conformation of the pressure profile. For example, FIGS. 3 and 4 show control of the rings (FIG. 3) to emit about 3 psig from ring 61, about 5 psig from ring 62 and about 4 psig from ring 63 and the resultant air pressure profile experienced by the backside of a substrate (FIG. 4). This type of profile would be used in a situation where the least amount of polishing is desired at the edge of a substrate, with somewhat more polishing desired in the center of the substrate, and with the greatest rate of polishing desired in between the edge and the center of the substrate. Of course, other profiles can be shaped as desired.

Preferably, the process of polishing according to the present invention includes moving at least one of the carrier and polishing surface against which the substrate is polished relative to the other in a nonlinear path while maintaining substantially constant instantaneous relative velocity between the polishing medium and all points on the carrier. However, the apparatus of the present invention is not limited by type of polishing motion and could be used for example to polish a substrate by rotating the carrier against a rotating polishing surface. Examples of some of the more preferred polishing techniques and apparatus for performing the same are described in copending U.S. application Ser. No. 08/961,602, filed Oct. 31, 1997, and U.S. Pat. No. 5,759,918, both of which are incorporated by reference herein in their entireties. Additional polishing techniques are disclosed in a copending application filed concurrently herewith, titled "Polishing Media Stabilizer", U.S. application. Ser. No. 09/258,036, filed Feb. 25, 1999. This application is also incorporated herein in its entirety, by reference thereto.

As an example, after loading the substrate 10 between the polishing surface 20 and carrier 50, pressurized gas (e.g. pressurized air) is injected through rings 61, 62, 63 as described herein, to create a bearing layer between the substrate carrier 50 and a back side of the substrate 10, such that the back side of the substrate does not contact the substrate carrier. At least one of the substrate carrier 50 and polishing surface 20 are then driven to effect a polishing action between a front side of the substrate 10 and the polishing surface 20. The pressurized gas exerts a polishing force that is substantially normal to the directions of polishing and which acts to force the substrate against the polishing surface.

The bearing layer produced by the injection of pressure gas as described above, allows free floating of the substrate with respect to the carrier, within the bounds of ring 80. This free float ability, combined with the driving motions of the carrier and or polishing surface and the boundary created by the ring 80, produces a controlled precession motion of the substrate during polishing. The characteristics of the precession motion can be controlled by controlling the shapes and speeds of the polishing path of the carrier with respect to the polishing surface.

Figure 5:
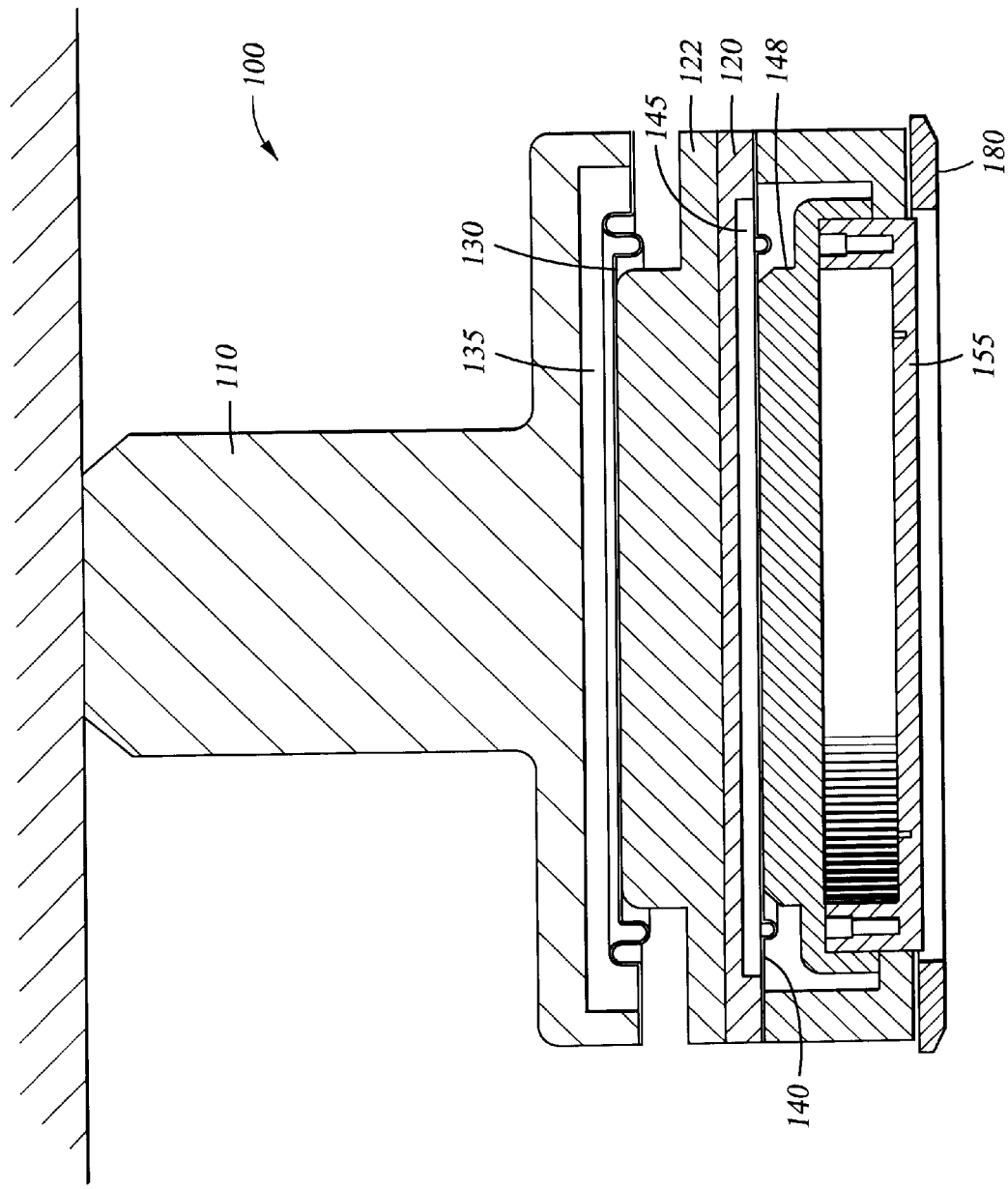
FIG. 5 is a sectional view of a carrier according to the present invention.

FIG. 5 shows a first arrangement 100 for control of the containment ring pressure and control of the gross pressure on the face plate, according to the present invention. In this arrangement, the carrier plate 155 is mounted to a carrier loading column 110, via seal plates 120, 122. A first diaphragm 130 is mounted between the seal plate 122 and the carrier loading column 110 to form an upper pressurizable chamber 135. A second diaphragm 140 is mounted between seal plate 120 and the carrier plate 155 to form a lower pressurizable chamber 145.

The location of the carrier loading column 110 forms the basis for gross positioning of the carrier. The upper pressurizable chamber 135 is pressurized to distend diaphragm 130 by a desired amount to advance both the containment ring 180 and the carrier plate 155 toward the substrate and the polishing media. Upper pressurizable chamber 135 provides the primary load control of the containment ring 180 that provides side load bearing control of the substrate during polishing.

Pressurization of the chamber 145 results in a distention of the diaphragm 140 against the carrier plate seal ring 148 which further advances, by secondary control, the carrier plate 155. After positioning the containment ring 180 and carrier plate 155 as described above, the bearing layer 70 is generated as described above and may be controlled and shaped as necessary. Additional or less force to the containment ring 180 and/or carrier face plate may be adjustably controlled when and as necessary.

Figure 6:
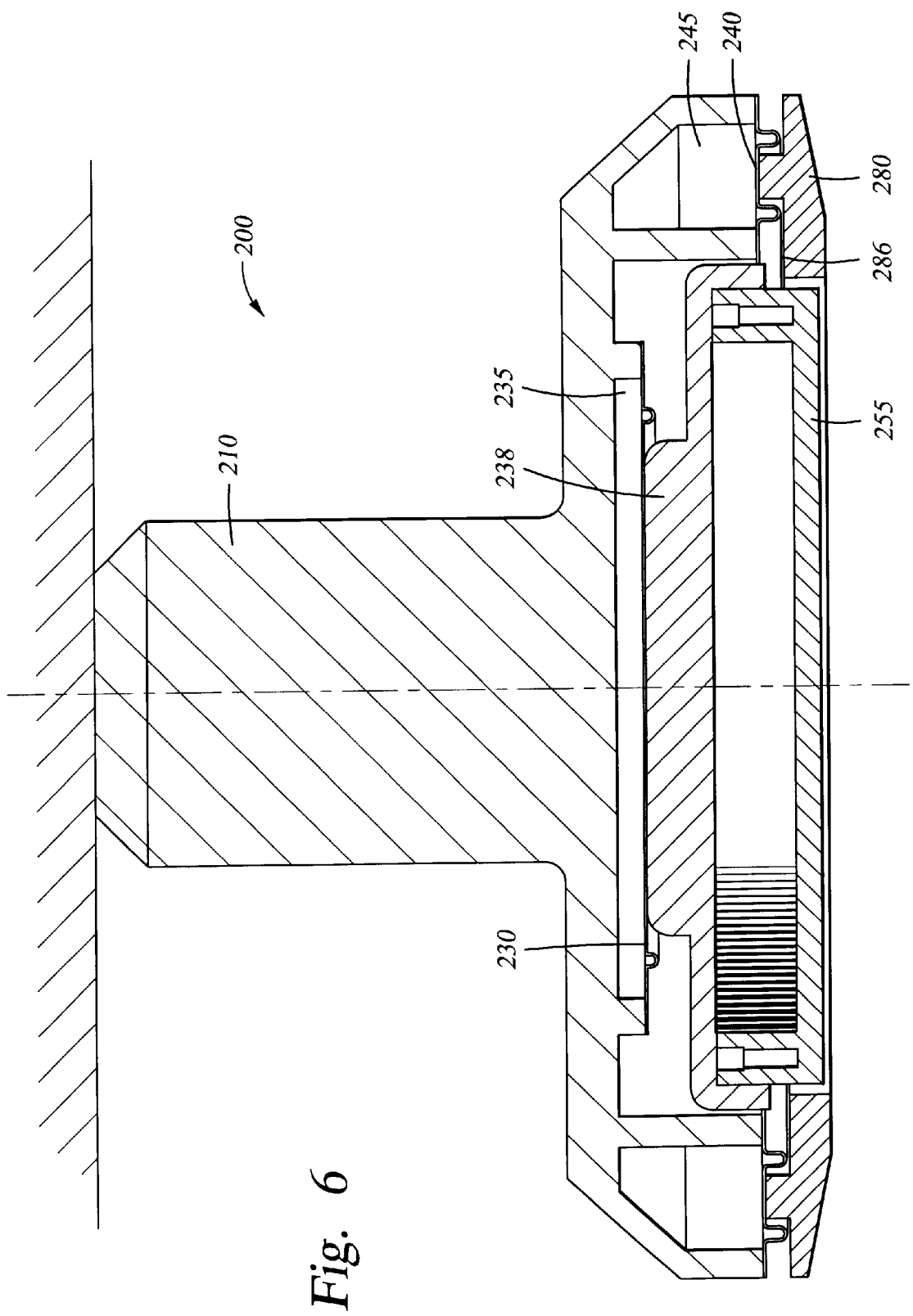
FIG. 6 is a sectional view of another embodiment of a carrier according to the present invention.

An alternative arrangement for control 200 is shown in FIG. 6, in which the carrier plate is primarily controlled by an upper pressure chamber 235 formed between an upper diaphragm 230 and the carrier loading column 210. Pressurization of chamber 235 causes a distention of diaphragm 230. Distention of the diaphragm 230 moves the carrier plate seal ring 238 away from the carrier loading column 210, and, consequently displaces the carrier plate 255 toward the substrate and the polishing media.

In this arrangement, the containment ring is controllable independently of control of the carrier plate 255, by pressurization of the chamber 240. Pressurization of chamber 240 causes distention of the diaphragm 245 which, in turn, distends the ring 280 with respect to the carrier plate 255. Thus, additional pressure can be applied through the containment ring 280 to the polishing media without affecting the load on the carrier plate 255.

Figure 7:
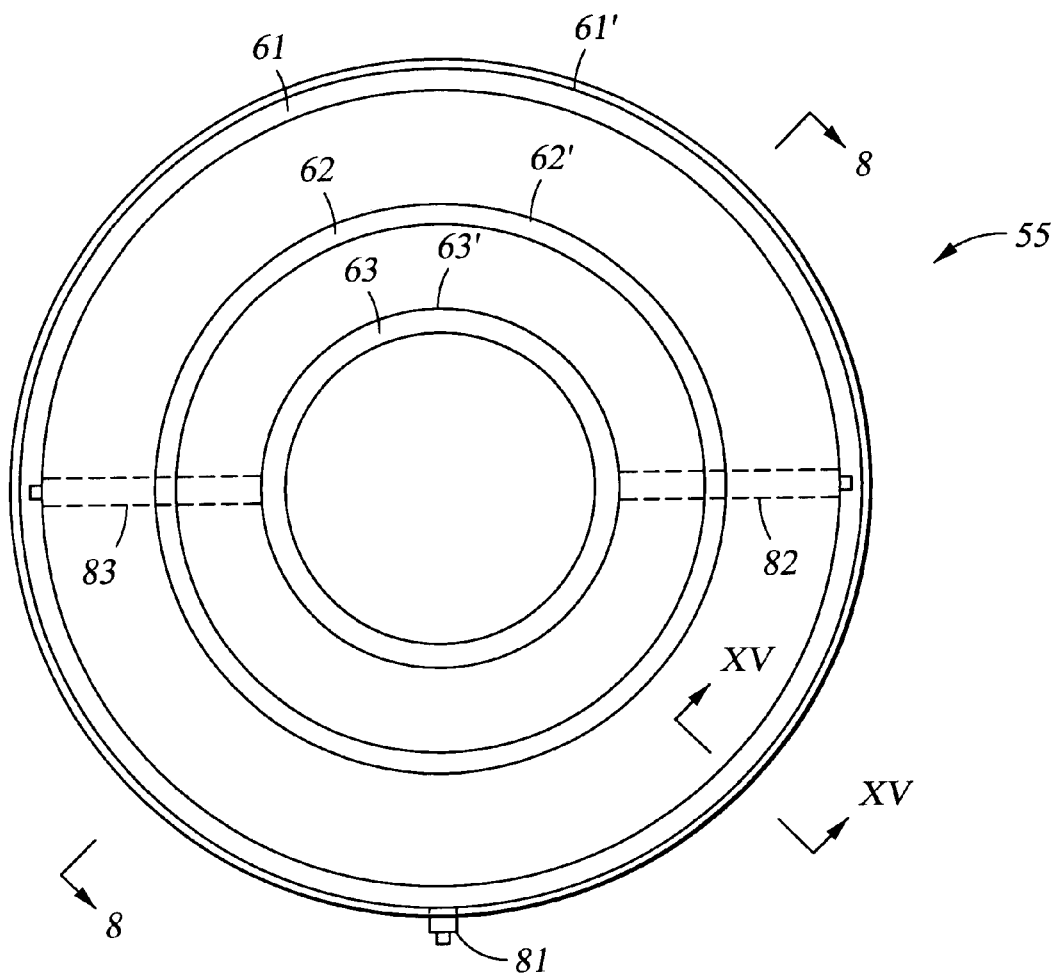
FIG. 7 is a bottom view of one embodiment of a carrier plate 55 according to the present invention.

FIG. 7 is a bottom view of an embodiment of a carrier plate 55 according to the present invention. The plate 55 is generally formed of a relatively strong, relatively non-corrosive metal such as cast aluminum or stainless steel.

Grooves 61', 62' and 63' are formed in the plate 55 for receiving rings 61, 62 and 63, respectively. In one example, the rings are approximately 3/32" thick. However, an optimum thickness has not been determined and there appear to be no restrictions as to thickness from a performance standpoint. Ultimately, manufacturing considerations may dictate a preferred thickness or range of thickness. The grooves may be conventionally machined, cast, or formed by plunge electric discharge machining (i.e., plunge EDM) and are preferably formed by plunge EDM. The rings are formed of a microporous material which will pass the desired medium (e.g., air, water, mixture, etc.) but at the same time act as a restrictor that forms a sufficient pressure drop between the back side of the carrier plate 55 and the face of the carrier plate 55 to float the substrate 10. Flow to the porous ring may controlled with air/liquid supply (not shown) which may be manually or computer controlled.

The microporous material may be made of POREX® or other substantially equivalent porous polyethylene, microporous bronze, microporous titanium, microporous stainless steel, microporous gold, microporous ceramics or other substantially equivalent microporous materials. Preferred materials are microporous stainless steel, especially when the carrier plate is made of stainless steel, or microporous polyethylene, particularly POREX®. POREX® is particularly attractive because of its low cost and may even be used to form a "disposable" carrier plate in which the carrier plate itself is made of a relatively wear resistant polymer such as polyphenko ertalyte or DELRIN®. POREX® is also preferable for use with metal carrier plates as described above, due to the relatively lower cost of the polymers compared to the metals.

Figure 8:
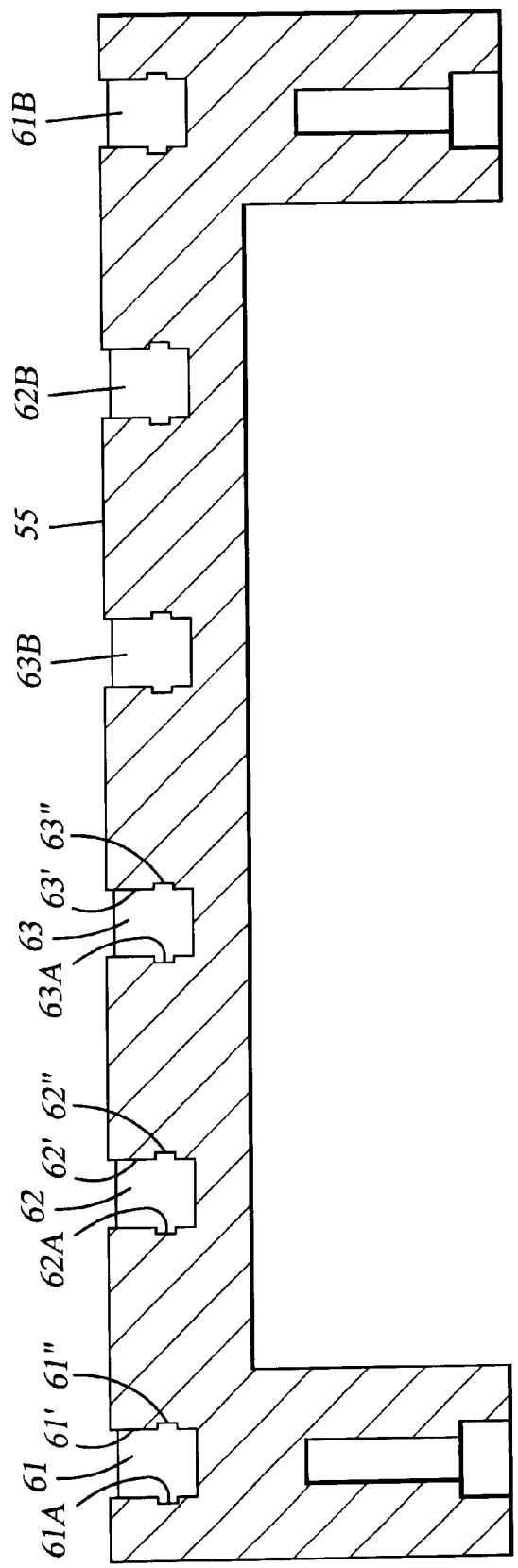
FIG. 8 is a cross-sectional view, taken along line 8—8, of the carrier plate shown in FIG. 7.

The rings 61, 62 and 63 are preferably press fit into the grooves 61', 62' and 63', respectively. In the case of microporous polymer rings, locking grooves 61", 62" and 63" are formed within the grooves 61', 62' and 63', respectively, as shown in the cross-sectional view of FIG. 8. The microporous polymer rings 61, 62 and 63 are compressible and can therefor be formed with locking collars 61a, 62a and 63a, respectively. The rings are compressed for insertion into the grooves and then released once in position. Upon re-expansion of the rings, the collars 61a, 62a and 63a, seat within the locking grooves 61", 62" and 63", respectively, thereby locking the rings in position in the respective grooves.

It is further preferable, when using porous polymeric rings, to recess the faces of the rings 61b, 62b and 63b by about 0.001" with respect to the face of the carrier plate 55, to ensure that the rings do not protrude beyond the planarity of the face of the carrier plate 55. Rings which are recessed 0.001" do not appreciably effect the polishing results from that carrier. On the other hand, if one or ore rings or portions thereof extend from the planar face of the carrier plate, a substantial anomaly in polishing results will be evident.

Referring back to FIG. 7, supply tubes 81, 82 and 83 are shown passing into the carrier plate and connecting to the respective rings 61, 62 and 63 for external connection thereof with a controllable air/liquid supply (not shown) which may be manually or computer controlled.

Figure 9:
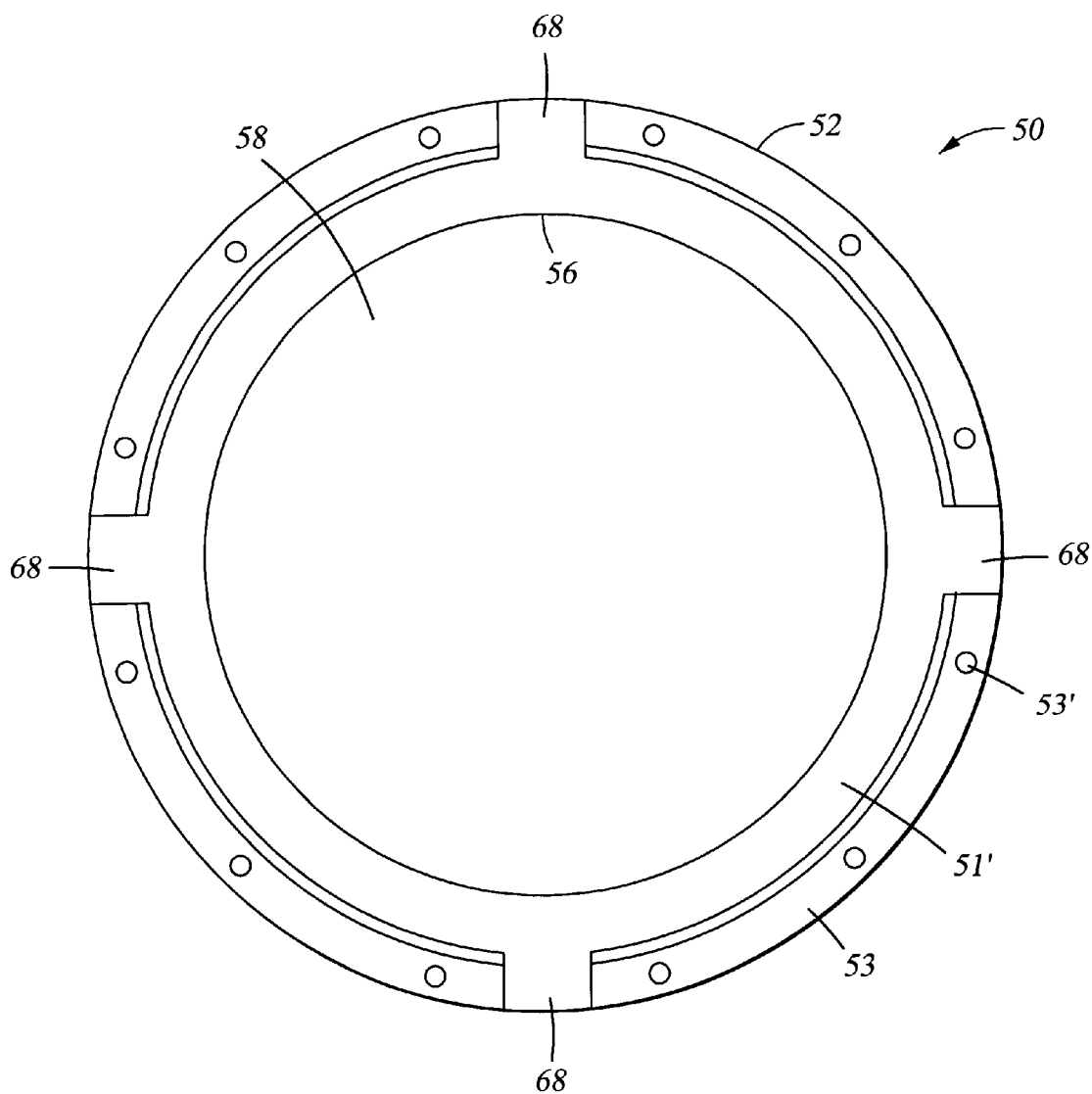
FIG. 9 is a bottom view of a carrier plate mount 52 of the carrier 50, having had the carrier plate 55 removed.

FIG. 9 is a bottom view of a carrier plate mount 52 of the carrier 50, having had the carrier plate 55 removed. The carrier plate mount 52, like the carrier plate 55, is also preferably made of cast aluminum or stainless steel. The carrier plate mount 52 is centrally recessed 56 in this example to receive a bladder 58 that can be inflated/distended to function as the primary driver of the carrier plate 55 as described above.

A step or shoulder 51[1] is formed circumscribing the recess 56 for supporting the carrier or bearing plate 55, thereby preventing the bearing plate 55 from retracting too far into the carrier to the extent that damage of the bladder 58 might occur. Access grooves 68 are provided through ring mount 53 at the level of the shoulder 51[1]. The access grooves 68 permits access of the supply tubes 81, 82 and 83 without deformation upon mounting of the ring 80 to the ring mount 53. The order of assembly of the carrier includes alignment of the supply tubes 81, 82 and 83 with respective access grooves 68 and then placement of the carrier plate 55 on the shoulder 51[1]. After properly placing the carrier plate 55, the ring 80 is next affixed to the ring mount 53 preferably using studs, bolts or screws in mounting holes 53'.

Figure 10:
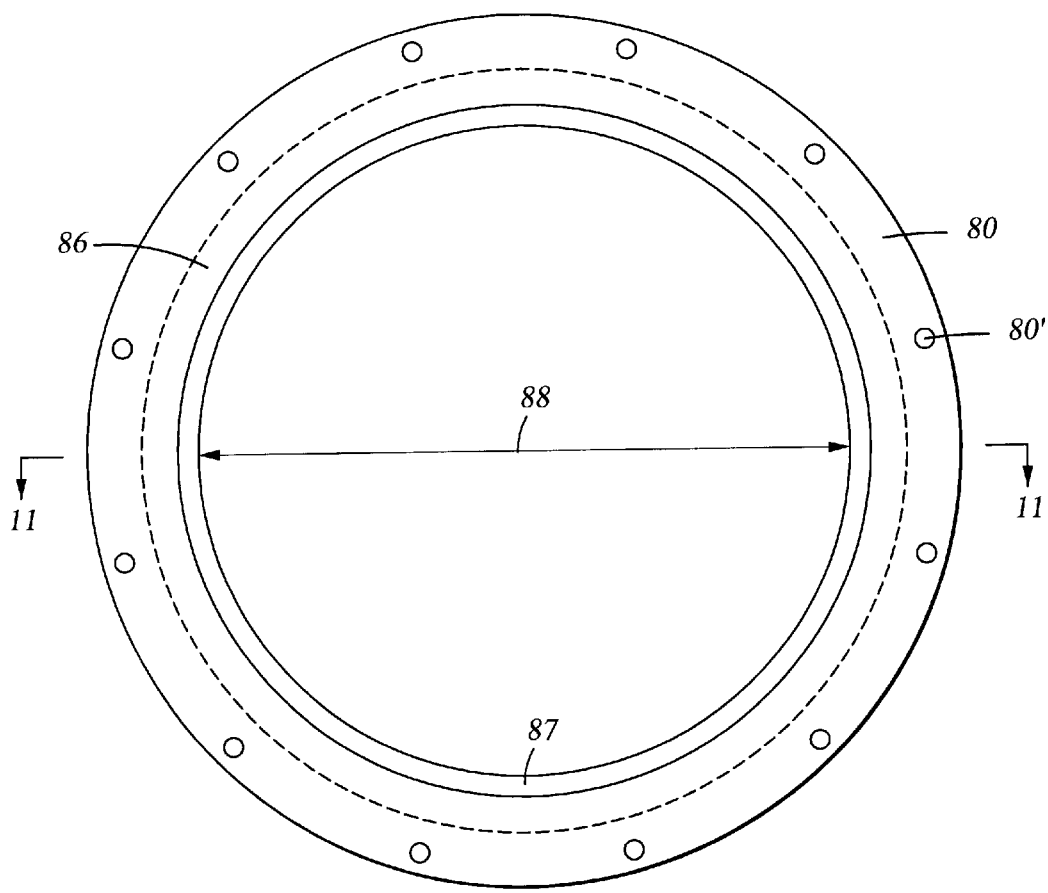
FIG. 10 shows a bottom view of an exemplary ring or containment ring 80.

An exemplary ring or containment ring 80 is shown from a bottom view in FIG. 10. Containment ring 80, when installed on the carrier 50, supplies the appropriate horizontal forces necessary to horizontally bias the substrate to be polished. This ensures that the substrate remains positioned between the carrier 50 and the polishing surface when one or both of the carrier 50 and polishing surface are moving with respect to the substrate. Additionally, as designed herein, the inside diameter 88 of the ring 80 is sufficiently greater than the diameter of the substrate to be polished. The larger ring diameter allows precession of the substrate, within confines of the containment ring 80, as the carrier 50 is orbited or otherwise moved through its polishing pattern with respect to the polishing surface. Of course, the same effect can be obtained through moving the polishing surface with respect to the carrier 50, and also a combination of movements of the carrier and polishing surface can effect results as well.

The containment ring 80 is generally made of a material having good dimensional stability, wear properties, and energy absorbing properties. For example, the containment ring 80 may be made from POLYPHENKO ERTALYTE (PPE) or DELRIN, or similar material, preferably PPE.

Figure 11:
FIG. 11 is a cross-sectional view, taken along line 11—11, of the ring shown in FIG. 10.

The containment ring 80 has a ledge portion 86 around the inner circumference thereof. An inner diameter of the ledge portion 86 is only slightly larger than the outer diameter of the plate 55,155,255 of the substrate carrier so as to form an outer boundary thereof, within which the substrate being polished is contained as it precesses and is polished. The ring 80 is preferably tapered by an angular cut 89, or molded or otherwise formed to this conformation, along its outside circumference as shown in the cross sectional view in FIG. 11. Additionally, it as been found to be preferable to form a slight undercut or countersink 87 in the ledge portion 86 as shown in FIG. 11. It is believed that this undercut 87 allows a more even and constant air/fluid flow over the entire polishing surface defined by plate 55,155,255 and particularly along the edge boundaries.

The ring 80 includes mounting holes 80' spaced to align with mounting holes 53'. After properly placing the carrier plate 55 as described above, the ring 80 is next affixed to the ring mount 53 by alignment of holes 80' and 53' and affixing the components, preferably using studs, bolts or screws in mounting holes 53'. Once assembled, the ring 80 allows free vertical movement of the carrier plate 55, but prevents the carrier plate from distending too far downward or falling out of the assembly by contact between the carrier plate seal ring and ledge portion (e.g., 238 and 286, respectively, in FIG. 6).

FIG. 12A is a bottom view of another embodiment of a carrier plate 655, for purposes of illustrating that many different designs/styles of carrier plates can be designed to meet the inventive concepts discussed herein. In this embodiment, the main flow of the pressurized fluid is conducted through openings 661 and the flow is preferably spatially extended through grooves 662. Openings 663 are provided around a locus of a second circle positioned radially inwardly from the opening 661 and are adjustable to provide biasing of the fluid layer against the substrate. Grooves 665 are preferably provided to spatially extend the pressure flow from the opening 663. Preferably, the area surrounded by the imaginary circle connecting the openings 663 is about the same as the area surrounded by the imaginary circle connecting the openings 661 minus the area surrounded by the imaginary circle connecting the openings 663.

Vacuum/ blow off openings 670 are provided radially inwardly of the openings 663. Vacuum may be drawn through openings 670 to pick up the substrate after a polishing procedure or to pick up the substrate anytime a polishing procedure is not occurring. Additionally, a pressurized flow can be passed through the openings 670 to blow off the substrate after picking it up and moving it to a location that the substrate is to be placed. Optionally, grooves 672 (shown in phantom) may be placed to spatially extend the vacuum/pressure applied through some or all of the openings 670. Also, the openings 670 are preferably, but not necessarily, staggered so as to lie along two imaginary concentric circles, as shown in FIG. 12A.

FIG. 12B is a cross sectional view, taken along section line XII—XII, of one of the grooves 662 extending from openings 661 in FIG. 12A. The groove is preferably radiused at the bottom, to help prevent accumulation of slurry or other unwanted accumulation of materials therein. The depth 662' of groove 662 is preferably substantially equal to the width 662" thereof.

FIG. 12C is a detailed view of the insert 668 shown in FIG. 12A. FIG. 12C shows the spacing that exists between adjacent grooves 662. Grooves 662 are also preferably radiused at their ends to help prevent unwanted accumulations of slurry, etc. The gap 667 between grooves 662 is preferably at least twice the width 662" and may be as great as the distance between openings 661, e.g., when no grooves are provided. The width 662" is preferably at least about 0.007" and as great as about 0.035". Preferably, the grooves 662 have a length less than or equal to about fifty times the width 662".

Figure 13:
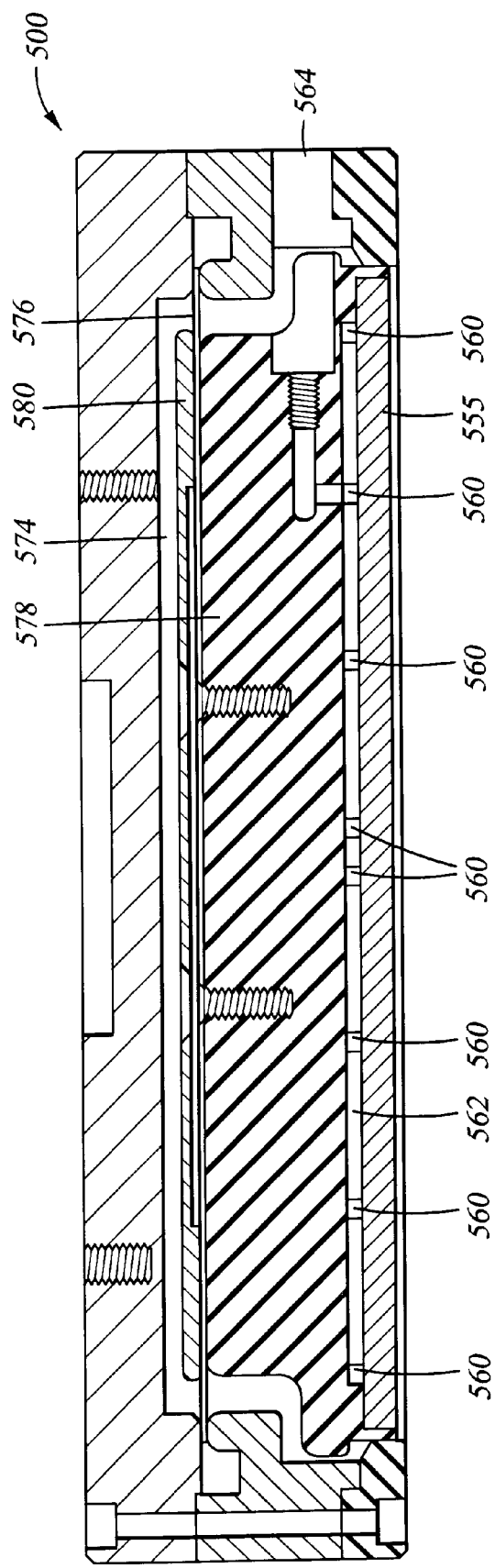
FIG. 13 is a sectional view of an embodiment of a carrier head 500 having a carrier plate 555 which is porous over substantially the entire surface thereof.

FIG. 13 is a sectional view of an embodiment of a carrier head 500 having a carrier plate 555 that is porous over substantially the entire surface thereof. The plate 555 is preferably formed of POREX® or other substantially equivalent porous polyethylene having a porosity from about 5 μm up to about 100 μm, preferably ranging from about 5 μm to about 10 μm, but could be constructed of microporous bronze, microporous titanium, microporous stainless steel, microporous gold or other substantially equivalent microporous materials. POREX® and other porous polyethylenes are particularly attractive because of their relatively low costs.

When constructed of microporous bronze, microporous titanium, microporous stainless steel, microporous gold or other substantially equivalent microporous materials, the overall porosity of the porous plate 555 is defined by an average porosity of about 0.2–1000 μm, preferably from about 0.2 to about 10 μm±10%. The preferred porosity characteristics allow an air flow of about 80–110 ft³/hr at a feed pressure of 60–70 psi, with a preferred flow rate of 100 ft³/hr±5% at a feed pressure of about 70 psi.

Ports 560 connect the porous plate 555 with an external source of pressurized air, fluid or combination. Preferably a source of pressurized water or water and air is employed in this embodiment, although other chemical fluid mixtures are another possibility. A channel or channels 562 are located between the plate 555 and carrier plate seal ring 578 to connect the ports 560 to supply input 564. The supply input connects to an external controllable source of pressurized air, fluid, or combination thereof, which may be computer or manually controlled.

Optionally, a metallic backing plate 580 may be mounted to the back surface of carrier plate seal ring 578 .to help even the pressure distribution of the primary driving force down upon the carrier plate seal ring. The metallic backing plate is preferably made of aluminum or stainless steel. A pressure membrane 576 is provided to form a pressure chamber 574 to generate the force that is applied to carrier plate seal ring 578.

Figure 14A:
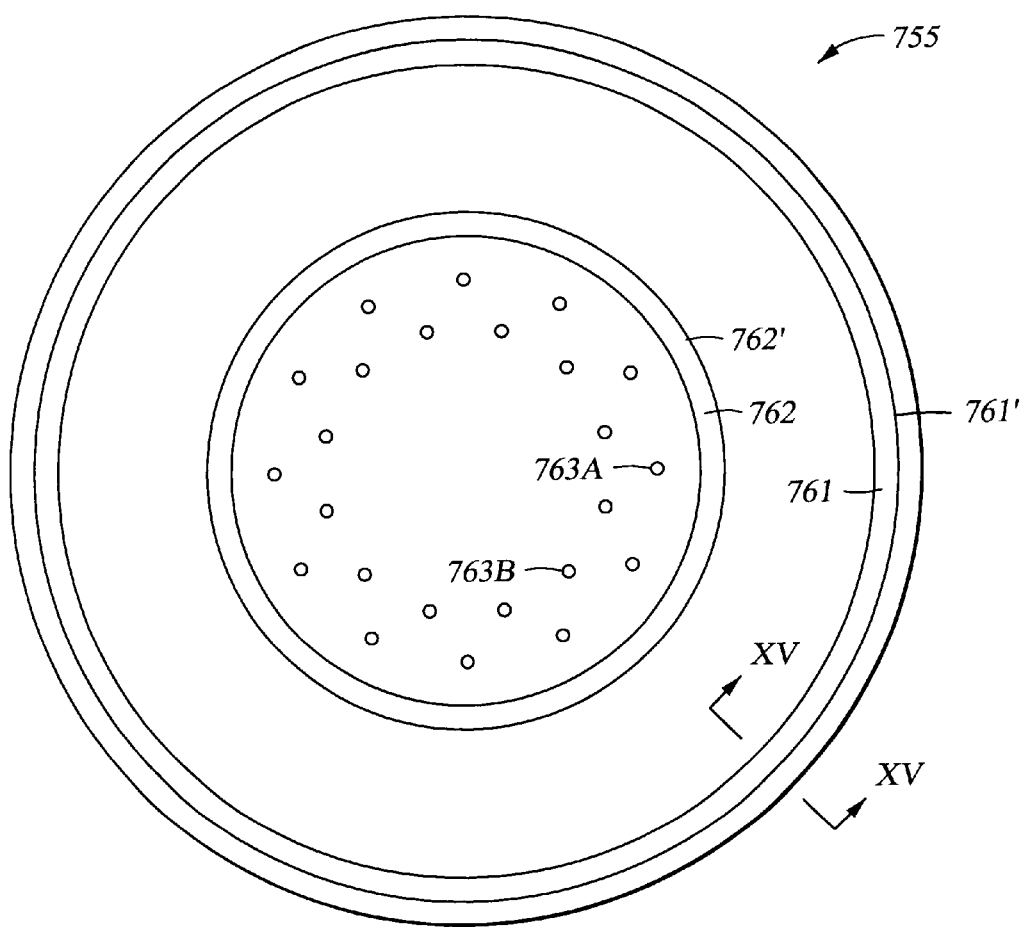
FIG. 14A is a bottom view of another embodiment of a carrier plate 755 according to the present invention.
Figure 14:
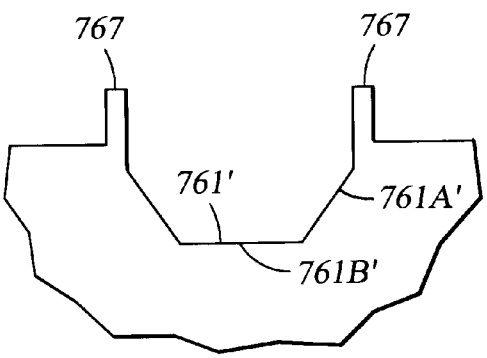
FIG. 14B shows one embodiment of a cross sectional shape of groove 761', taken along section lines XV—XV in FIG. 14A.
FIG. 14C shows another embodiment of a cross sectional shape of groove 761', taken along section lines XV—XV in FIG. 14A.
FIG. 14D is a sectional view of ring 761 fitted in the embodiment of groove 761' shown in FIG. 14C.
Figure 14:
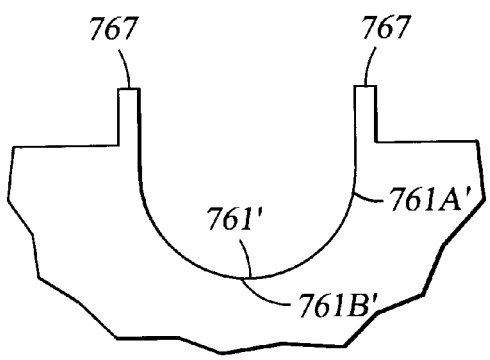
Figure 14:
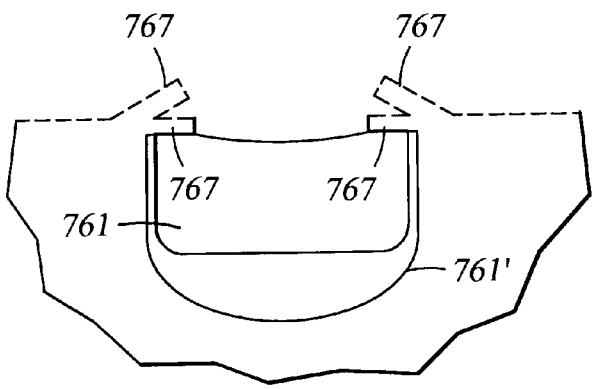

FIG. 14A is a bottom view of another embodiment of a carrier plate 755 according to the present invention. The plate 755 is generally formed of a relatively strong, relatively non-corrosive metal such as cast aluminum or stainless steel. Grooves 761' and 762' are formed in the plate 755 for receiving porous rings 761 and 762, respectively. In one example, the rings are prepared from microporous stainless steel supplied by High Purity Supplies, Fremont, California, which is a distributor for Mott Metallurgical Corp., Farmington, Connecticut. In this example the porosity is about 0.5 μm. However, the microporous material may be made of other substantially equivalent porous materials, such as microporous bronze, microporous titanium, microporous gold, microporous ceramics, POREX® or microporous polyethylene. Also, the porosity of the rings may be selected from a range of about 0.2 μm to about 100 μm in the case of the microporous metals and ceramics, and about 5 μm to about 100 μm for microporous polymers.

The grooves may be conventionally machined, cast, or formed by plunge electric discharge machining (i.e., plunge EDM) and are preferably formed by plunge EDM, as noted above. The rings are formed by machining, lapping, and then electropolishing to open the pores back up which have been closed over by the machining and lapping stages.

FIGS. 14B and 14C show two different cross sectional shapes, among others, taken along section lines XV—XV in FIG. 14A, that the groove 761' may be formed to have. Although the grooves can be formed as square channels, it is preferred that the angles between the bottom wall 761b' and side walls 761a' are at least obtuse, and a semicircular channel, as shown in FIG. 14C is even more preferred. The main reason for the preference is to avoid any crevices that may accumulated slurry, etc. The same design considerations apply equally to groove 762'.

The plate 755 is machined or otherwise formed to have a lip 767 adjacent each side wall of the groove 761' (as well as the groove 762', although not shown). After formation of the ring 761 as described above, the ring 761 is next press fit into the groove 761' as shown in FIG. 14D, the ring having been machined and finished for press fitting within about a 0.001" to about 0.003" tolerance. After press fitting, the entire plate 755 is pressed to deform the lips 767 that form physical stops that will prevent any lifting of the rings out of their positions within the grooves.

In this embodiment, the main flow of the pressurized fluid is conducted through ring 761, with a flow rate ranging from about 30 to about 100 standard cubic feet per hour, more preferably about 50 to 90 standard cubic feet per hour, and still more preferably about 60 to 70 standard cubic feet per hour. The flow through the inner circle ring 762 is much lower, preferably about −3 to 3 standard cubic feet per hour. At least one orifice (not shown) is provided for each of the grooves 761' and 762' and connected to a pressurized fluid source so as to supply an independently controlled flow of pressurized fluid to each of the rings 761, 762.

Openings 763a and 763b are provided along two concentric imaginary circles, respectively, adjacent and radially inward of groove 762'. Openings 763a and 763b are connected to at least two ports for connection to a vacuum/pressure source to provide vacuum/blow off functions similar to that described above with regard to reference numeral 670 in FIG. 12A. At least two ports are preferred so that flushing of the openings may be performed to help prevent any clogging of the openings 763a, 763b.

Figure 15:
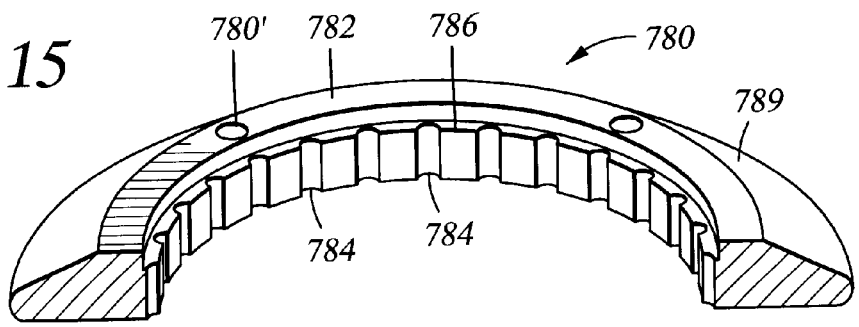
FIG. 15 shows another embodiment of a containment ring according to the present invention.
Figure 17:
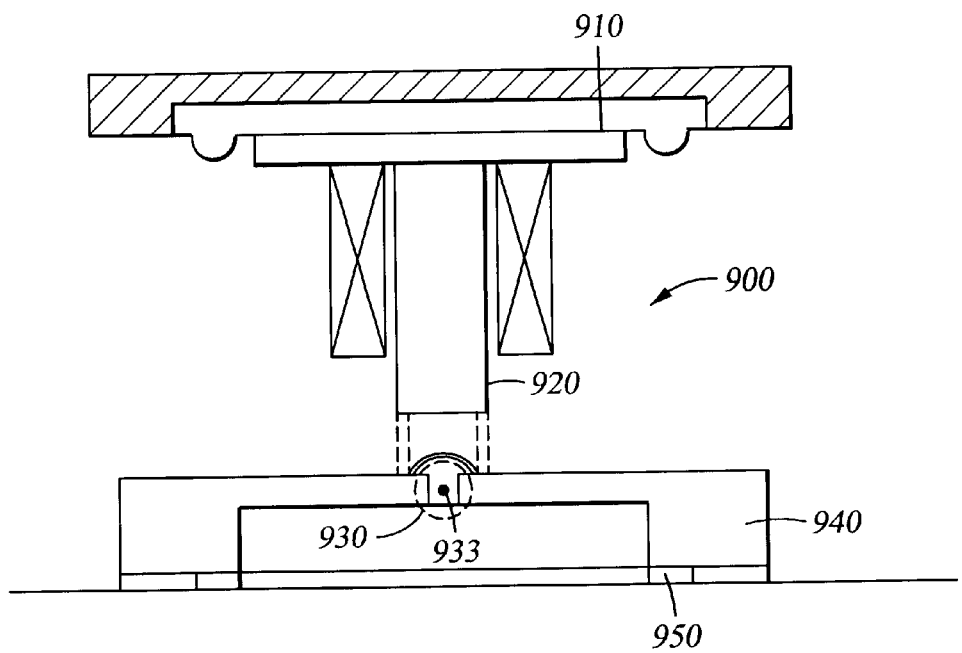
FIG. 17 is a schematic sectional view of a prior art device illustrating certain disadvantages thereof.
Figure 18:
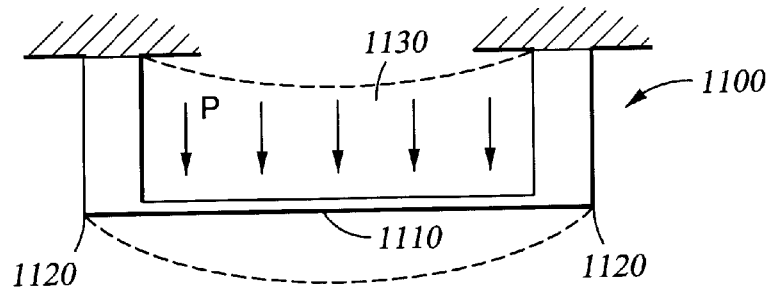
FIG. 18 illustrates a problem inherent in a prior art carrier 1100 having a deformable plate 1110.
Figure 19A:
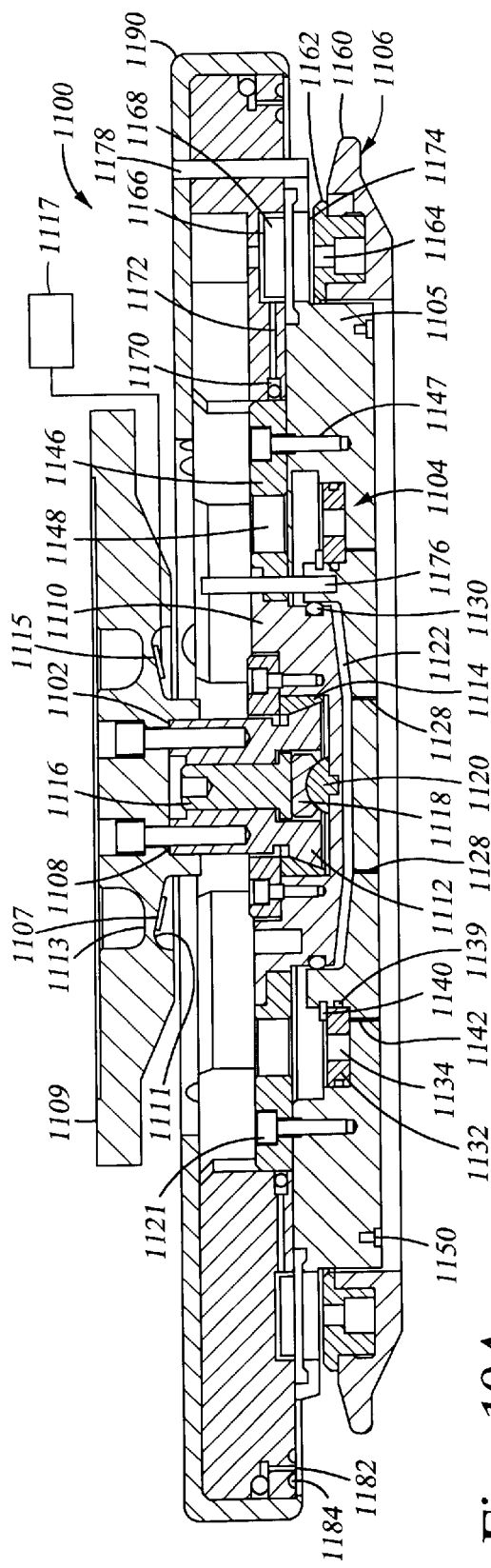
Figure 19B:
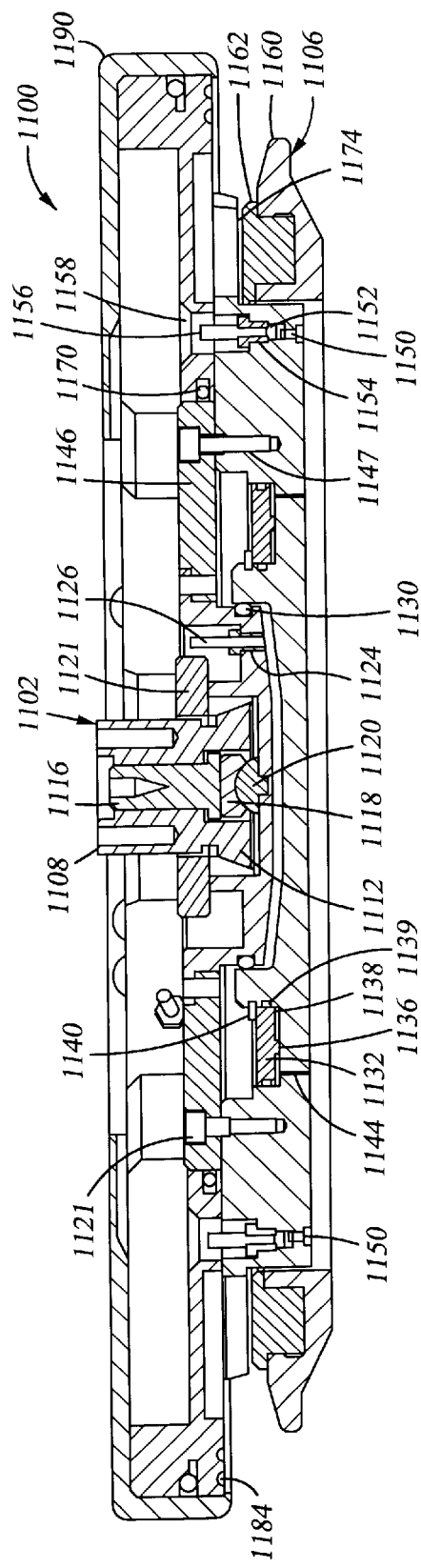

FIG. 15 shows another embodiment of a containment ring 780 that is preferred for use with the carrier plate of FIG. 14A. The ring 780 is preferably tapered at 789 similar to the ring 80 in FIG. 11, along its outside circumference, so as to taper away from the polishing surface, which substantially planar contact surface 782 is designed to contact. Additionally, grooves or notches 784 are spaced about the inner circumference of the ring 780 to provide outlets for the pressurized fluid emitted by the carrier plate 755 during polishing.

An inner circumferential groove 786 joins the notches 784 thereby further enhancing the outlet path for the pressurized fluid. The inner circumference of the ring 780 has a circumference having a diameter that is only slightly larger than the outer diameter of the plate 755 of the substrate carrier so as to form an outer boundary thereof, within which the substrate being polished is contained as it precesses and is polished. During the polishing process, as the substrate precesses, it covers a portion of the outer ring 761 at any given time and location of the precession path. The covered portion of the ring 761 takes advantage of the grooves 784 at that time as a pathway for the pressurized fluid that would ordinarily pass between the substrate and the ring, as does the flow in the areas where the substrate does not contact the containment ring 780 and cover a portion of the ring 761. This helps to maintain a more even pressure boundary around the entire circumference of the substrate during polishing. The ring 780 includes mounting holes 780' spaced to align with mounting holes in the carrier, similarly to the description provided above with regard to mounting holes 80'.

FIG. 16A is a sectional view of another embodiment of a carrier plate 850 according to the present invention. The carrier plate 855 is generally formed of a relatively strong, relatively non-corrosive metal, as described above with regard to the embodiment shown in FIG. 14A. Groove 861' and ring 861 are formed as described above with regard to groove 761' and ring 761 to form the restrictor in this embodiment. Only a single ring 861 is employed and a flow rate ranging from about 30 to about 100 standard cubic feet per hour, more preferably about 50 to 90 standard cubic feet per hour, and still more preferably about 60 to 70 standard cubic feet per hour is passed therethrough during operation. At least one pressure supply line 862, and preferably a plurality of lines, are provided for connecting the groove 861' to a pressurized fluid source via pressure fitting(s) 863 so as to supply a controlled flow of pressurized fluid to the ring 861.

Vacuum blow-off openings 865a and 865b are provided along two concentric imaginary circles, respectively, radially inward of groove 861'. Openings 865a and 865b are connected to at least two, and preferably a plurality of vacuum lines 867 for connection to a vacuum/pressure source to provide vacuum/blow off functions similar to that described above with regard to reference numeral 670 in FIG. 12A. During polishing, a positive or negative bleed can also be established through openings 865a and 865b in conjunction with the positive pressure flow through the restrictor (ring 861) to establish the air/fluid bearing between carrier plate 855 and the substrate. Additionally, a positive or negative pressure can be established in cavity 869 for purposes of deforming the carrier plate 855 to effect polishing forces against the substrate. Sealing members 871, such as an O-ring, diaphragm or piston ring are provided to seal the pressure flowing to the opening 865a, 865b from escaping to the exterior of the carrier plate by pathways other than through the openings 865a, 865b. Another sealing member 878, which may also be a minimally preloaded O-ring, diaphragm or piston ring, is provided to seal the entire chamber 869 to allow generation of pressure or vacuum therein for extending/retracting the entire carrier plate 855 and/or deforming the carrier plate. A diaphragm is preferred as it is less likely to generate particles during wear.

Containment ring 880 is preferably tapered at 889 similar to the other embodiments of containment rings disclosed herein. However, this ring 880 is loosely mounted within carrier mount 890 to allow a precessing motion with respect thereto, see FIG. 16B. Additionally, an annular groove is provided around the outer circumference of ring 880. A plurality of set screws or other retaining pins 892, preferably three or four, are threadably inserted and spaced equally about the inner circumference of the surface of the carrier mount 890 that interfaces with the outer circumference of ring 880. The amount of extension of the retaining pins 892 is adjustable to vary the precession pattern. The retaining pins 892 also retain the ring 880 with respect to the carrier mount 890, e.g., when the carrier is lifted from the polishing surface.

A porous ring 894 and groove 894' are formed and placed in a manner described above with regard to groove 761' and ring 761. At least one pressure supply line 896, and preferably a plurality of lines, are provided for connecting the groove 894' to a pressurized fluid source via pressure fitting(s) 897 so as to supply a controlled flow of pressurized fluid to the ring 894 to establish an air/fluid bearing between ring 880 and carrier mount 890.

The inner circumference 902 of the ring 880 is dimensioned to provide a snug fit with the substrate 1000. During a polishing operation, flow through ring 894 establishes a fluid/aerostatic bearing, as described above, which allows precession of the substrate 1000 and ring 880 as a unit. This feature is particularly advantageous when polishing substrates that include a flatted portion on the periphery thereof, or which are otherwise not completely circular, where precessing motions of the substrate can have damaging effects on the inner circumference of the containment ring due to repeated contact of the noncircular edge against the containment ring surface. Further, although a preferred shape is that of a ring 880, other shapes of containment barriers may be employed to allow the same precessing function, e.g., hexagonal, square, or even an irregularly shaped containment barrier.

The flow paths of the fluids from rings 861 and 894 are shown by arrows in FIG. 16B. The flow from ring 861 establishes a pressure or force "fence substantially near the outer circumference of the substrate 100. Flow then travels along pathway 1002, in the gap between containment ring 880 and carrier plate 855 and above the substrate 1000 and out through vents 1006 that are circumferentially spaced about the carrier mount 890. The flow from ring 894 is mainly along two pathways. Pathway 1004 is between the containment ring 880 and carrier mount 890, and then out through vents 1006. Pathway 1005 is between the containment ring 880 and carrier mount 890, and then out through vents the gap between the outer circumference of the containment ring 880 and the carrier mount 890.

Alternatively, a precessing containment ring as described above may be employed in combination with other more conventional forms of carrier plate. For example, a carrier plate with a backing pad interposed between the plate and the substrate for transferring polishing forces between the plate and the substrate may be used. Also, a carrier plate that applies forces directly to the substrate by direct contact therewith may be used.

FIGS. 19A–19D are schematic views of another embodiment of a carrier 1900 at different cross sectional planes across the carrier. In general, the carrier 1900 includes a gimbal assembly 1102 coupled to the carrier plate assembly 1104 with a retainer ring assembly 1106 disposed around the outer periphery of the carrier plate assembly. The carrier plate assembly 1104 includes a carrier plate 1105. The lower surface of the carrier plate 1105 is used to support a substrate for polishing on a polishing media.

The gimbal assembly 1102 includes a gimbal shaft 1108. The upper surface of the gimbal shaft 1108 is coupled to a gimbal interface plate 1109. The gimbal interface plate 1109 provides a structure to couple the gimbal shaft to a column of a CMP machine. The gimbal interface plate is described more fully in U.S. application Ser. No. 09/247,769 filed Feb. 2, 1999 and incorporated herein by reference.

The polishing system described herein can include a polishing endpoint detection system. A polishing endpoint can occur, for example, when an underlying layer is reached or when the substrate surface has been polished relatively smooth compared to a starting substrate surface texture. The endpoint can be detected by measuring a differential stress and/or strain on the carrier, gimbal or associated components during the polishing process. A change from a constant during polishing can indicate that an endpoint has been reached. One embodiment includes one or more strain gages 1107 coupled to the gimbal interface plate 1109 or the gimbal shaft 1108. Preferably, four strain gage points having two strain gages per point are located at orthogonal planes, i.e., a horizontal X-Y axis, to form a full bridge configuration. As the substrate is polished in an oscillating motion, the carrier is subjected to an oscillating force. Voltage output from each strain gage generates a sinusoidal curve in one oppositely disposed pair of gages and a corresponding cosine curve in the other oppositely disposed pair of gages. The magnitude of the curves can be squared, then added, then a square root generated from the sum of the squares to generate a composite magnitude of stress and/or strain. A change in the composite magnitude indicates a change in the polishing force.

The strain gages 1107 can be coupled to the gimbal interface plate. For example, the gimbal interface plate 1109 can include a lower recess 1111 and an upper recess 1113 disposed radially around the interface plate. A junction of the lower recess and the upper recess forms a tapered or thinned portion 1115 where the strain gages can be positioned. The thinned portion allows more flexure of the section and adds sensitivity for input to the strain gages. The strain gages 1107 sense the flexure stresses on the thinned portion 1115 caused by frictional forces on the substrate, which are transmitted through the carrier assembly 1104, the gimbal assembly 1102, the gimbal interface plate 1109 and to the thinned portion 1115. Output from the strain gages are provided to a strain sensor 1117. The strain gages 1107 could also be coupled to other components such as the gimbal shaft. Preferably, the gages are coupled to thinner sections for sensitivity.

A lower spherical portion 1112 of the gimbal shaft 1108 is engaged with a gimbal cup 1110. The spherical portion 1112 is disposed at the lower end of the gimbal shaft 1108 and has an outer tapered surface. The spherical portion 1112 engages a correspondingly conical gimbal ring 1114. The gimbal ring 1114 is restrained with the gimbal cup 1114 by a gimbal retainer 1121. The gimbal retainer 1121 is fastened to the gimbal cup 1114 by bolts or other fastening devices.

An inner portion of the gimbal shaft contains a threaded gimbal adjuster 1116. The gimbal adjuster can be rotated up or down and exerts pressure on a gimbal button 1118, disposed below the gimbal adjuster 1116. The gimbal button 1118 slidably engages a gimbal ball 1120 disposed below the gimbal button. The gimbal ball is concentrically located in a lower portion of the gimbal cup 1110. The gimbal assembly 1102 allows the assembly plate 1104 to rotate side-to-side and adjust to different planarization angles. The gimbal adjuster 1116 can be rotated downward for additional pressure on the gimbal button 1118 and the gimbal ball 1120 to adjust the frictional engagement pressure and therefore control the angular movement of the carrier plate assembly 1104. The gimbal cup 1110 is disposed above a corresponding surface of the carrier plate assembly 1104 to create a space 1122 therebetween.

The space 1122 provides a manifold through which air or other fluids can flow. An inner crown vacuum/blow off port 1124 is disposed through the gimbal cup 1110. A fitting 1126, such as a barbed fitting, can be coupled to the inner crown vacuum/blow off port 1124 to allow ease of coupling to a supply hose. The port 1124 is coupled to one or more inner crown ports 1128 disposed through the carrier plate 1105. The one or more inner crown ports 1128 can be disposed concentrically around the lower surface of the carrier plate assembly and provide an outlet for vacuum, air, or other fluid to a zone below the carrier plate assembly 1104. The gimbal cup 1110 is sealed with an O-ring 1130 or other seal against the carrier plate assembly 1104 so that the space 1122 is fluidicly coupled to the port 1124 and separate from other fluid circuits.

A manifold cover 1132 is disposed radially outward from the gimbal assembly 1102. The manifold cover 1132 isolates a second circuit of fluid flow to the lower surface of the carrier plate assembly. A port 1134 in the manifold cover provides an inlet for a fluid, such as air, other gas or liquid, to a portion below the manifold cover and to one or more outer crown vacuum/blow off ports 1142, 1144. The axial movement of the manifold cover 1132 downward is restrained by a cover stop 1136 to insure that a gap 1138 remains and that fluid can flow through the manifold cover into the outer crown vacuum/blow off ports 1142, 1144. Preferably, the outer crown vacuum/blow off port 1142 is off set radially and angularly from the outer crown vacuum/blow off port 1144 around the carrier plate assembly. The manifold cover 1132 may be sealably engaged with the carrier plate 1105 by inner and outers O-rings 1139A and 1139B. Further, the manifold cover 1132 is held in position by a retainer ring 1140.

A carrier top plate 1146 is coupled to the carrier plate 1105 by, for example, threaded fasteners 1147. Preferably, the surfaces between the carrier top plate 1146 and the carrier plate 1105 are planar with respect to each other and can be lapped for uniformity. Additionally, the fasteners 1147 can be used in numerous places, for example, 24 places, around the interface between the carrier top plate and carrier plate to assist in minimizing distortion therebetween. The carrier top plate 1146 includes a passageway 1148 through which hoses may be routed to port 1134 and the manifold cover 1132. Other passageways in the carrier top plate 1146 for other flow circuits are also provided.

A porous ring 1150, as has been described herein, is disposed radially outward from the outer crown vacuum/blow off ports 1142, 1144. The porous ring is preferably disposed near the outer periphery of the carrier plate 1105. The porous ring 1150 provides a substantially dispersed flow path of air, gas, or other fluid therethrough to create an aerostatic or hydrostatic bearing on the lower surface of carrier plate 1105. The aerostatic bearing supports a substrate, as has been described herein. An annular passageway 1152 is disposed above the porous ring 1150. One or more ports 1154 are disposed around the circumference of the carrier plate 1105 to flow fluid into the angular passage 1152. One or more fittings 1156 may be disposed in the port 1154 to provide a connection for a hose. The hose (not shown) can be routed through an opening 1158 in the carrier top plate 1146. It is believed that flow through the porous ring "captures" the fluid pressure, such as created by air, de-ionized water or other fluid within the circumference of the porous ring to assist in creating the aerostatic bearing. The flow through the porous ring can be varied from a gas to a liquid, alone or in combination thereof. Preferably, a quantity of liquid, such as water, acid, potassium hydroxide or water-solvable substance, is dispersed in the gaseous flow of air to assist in dissolving any deposits created in the porous ring as processing occurs. The dissolution of any deposits assists in maintaining the flow through the porous ring. Preferably, a plurality of ports 1154 are disposed around the carrier plate 1105 to allow a total flow between about 40 standard cubic feet per hour (SCFH) to about 150 SCFH and preferably about 60 SCFH to about 120 SCFH. A general pressure in the aerostatic bearing can be about 2 PSI to about 5 PSI or more and preferably about 2.5 to about 3.5 PSI. Optionally, vacuum may be applied to the porous ring to pick-up the substrate.

A ring 1160 is disposed radially outward from the carrier plate 1105. A support ring 1162 is disposed in a groove of the ring 1160. The ring 1160 can be made of materials as has been described herein. Preferably, the material is an acetyl plastic, such as Ertalyte . The ring 1160 and support ring 1162 are movably coupled by flexure 1171 to the carrier top plate 1146. A fastener 1164 disposed through the support ring 1162 engages a piston 1168. The piston 1168 is disposed in a piston chamber 1166. An annular channel 1170 is fluidicly coupled to the piston chamber 1166 through one or more ports 1172. Preferably, a plurality of piston chambers 1166, such as six chambers, are disposed around the surface of the carrier top plate 1146. The piston 1168, when pressurized, provides a downward force on the ring 1160 to provide a sufficient lateral support for a substrate disposed within the circumference of the ring 1160. Preferably, the lower surface of the ring 1160 is spaced from about 5 to about 15 mils above the lower surface of the substrate. The support ring 1162 is attached to the flexible members 1171 which are part of the plate 1105.

One or more polishing fluid delivery ports 1182 are disposed radially outward from piston chamber 1156. Preferably, one or more recesses 1184 are disposed radially inward and outward from the port 1182. The recesses inhibit wicking or dripping of the fluid flowing through the port 1182 along the lower surface of the carrier top plate 1146. One or more ports 1186 are coupled to the polishing fluid delivery port 1182. A fitting 1188 can be disposed in the port 1186 to provide a hose connection.

A cover 1190 is preferably disposed over the assembly of the various hoses, fittings and ports and is coupled to the carrier top plate 1146. The cover can be made of plastic material, such as DELRIN®, as has been described herein. An alignment pin 1176 is disposed through the carrier top plate 1146 and into the carrier plate 1105. An alignment pin 1178 is disposed through a cover 1190 and the carrier top plate 1146. The alignment pins assist in the alignment of the various components upon assembly and reassembly.

Thus, several fluid circuits are contained in the embodiment shown in FIGS. 19A–19D. A first fluid circuit includes fluid, such as air or other gas, flown into an inner crown vacuum/blow off port 1124 and into one or more inner crown ports 1128. A second fluid circuit includes a fluid such as gas flown through a port 1134 and a manifold cover 1132 and through one or more outer crown vacuum/blow off ports 1142, 1144. A third fluid circuit includes a fluid, such as a gas or liquid, flown through a port 1154 and the porous ring 1150. A fourth circuit includes fluid flown into a piston chamber 1166 to control movement of the ring 1160. A fifth circuit includes polishing fluid delivered through one or more ports 1182. A sixth circuit can also be included for sensing the pressure or vacuum in one or more of the flow circuits, such as the flow circuit to the inner crown, outer crown or porous ring. Each circuit can be switched with a valve from a pressure, vent or vacuum condition.

The embodiment of the carrier provides at least nine different modes of operation. In the first mode, the aerostatic bearing can be actuated by flowing through the porous ring 1150, while the vacuum/blow off port 1124 remains neutral, i.e., no additional flow through the port 1124. Additionally, the outer crown vacuum/blow off port 1142, 1144 can also remain neutral by having no flow therethrough. Each mode can vary the result obtained from polishing a substrate in the carrier, depending on the needs of the substrate to be polished. Generally, a baseline pressure condition created as flow through the porous ring is captured between the substrate and lower carrier plate. Flow through the outer crown port 1142 and inner port 1124 may be directed in a positive direction (i.e, towards the substrate) or in a negative direction (i.e., into the carrier). Typically, pressure provided at the outer crown port 1142 and the inner port 1124 is between atmospheric and the baseline established by the flow through the porous ring. Optionally, vacuum may be drawn through the outer crown port 1142 and the inner port 1124.

Figure 21:
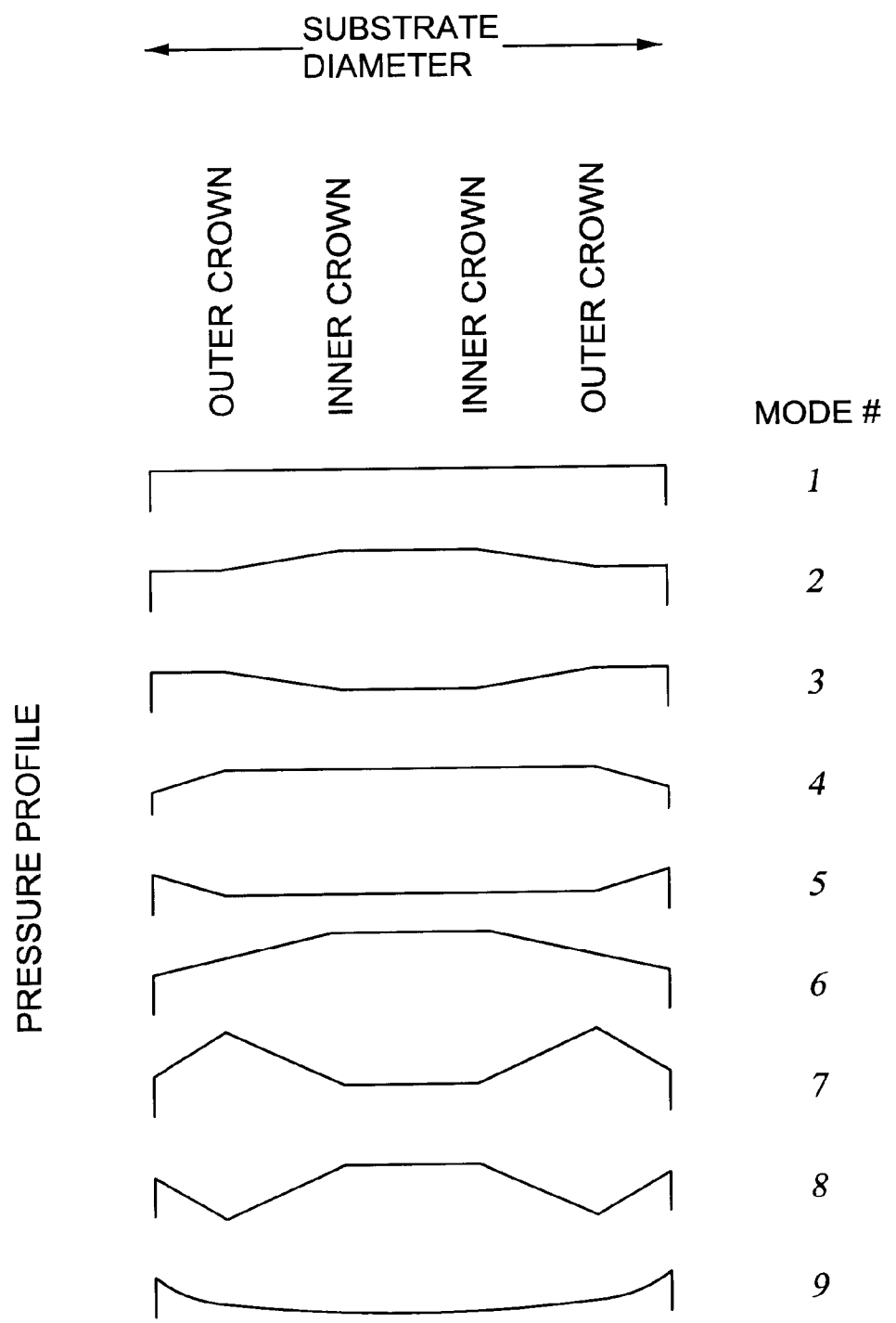
FIG. 21 depicts one embodiment of a fluid circuit coupled to a substrate carrier.

A second node can include actuating the aerostatic bearing with a fluid circuit and placing flow in the positive direction through the inner crown vacuum/blow off port with another fluid circuit while the outer crown vacuum/blow off port remains neutral with yet another fluid circuit. Generally, the pressure can be increased from 0 to about 2 PSI or more over the pressure created by the aerostatic bearing through the porous ring 1150. Other modes are detailed in Table 1 below. Pressure profiles corresponding to the modes listed in Table 1 are depicted in FIG. 21. Further, each of the listed modes can be altered by turning the aerostatic bearing off (i.e., removing the fluid flow thereto). The different modes allow differential polishing of the substrate surface by applying different forces to different areas of the substrate as the substrate is polished.

| Mode | Air Bearing | Inner Crown | Outer Crown |
| --- | --- | --- | --- |
| 1 | On | Neutral | Neutral |
| 2 | On | Positive | Neutral |
| 3 | On | Negative | Neutral |

-continued

| Mode | Air Bearing | Inner Crown | Outer Crown |
| --- | --- | --- | --- |
| 4 | On | Neutral | Positive |
| 5 | On | Neutral | Negative |
| 6 | On | Positive | Positive |
| 7 | On | Negative | Positive |
| 8 | On | Positive | Negative |
| 9 | On | Negative | Negative |

Figure 20:
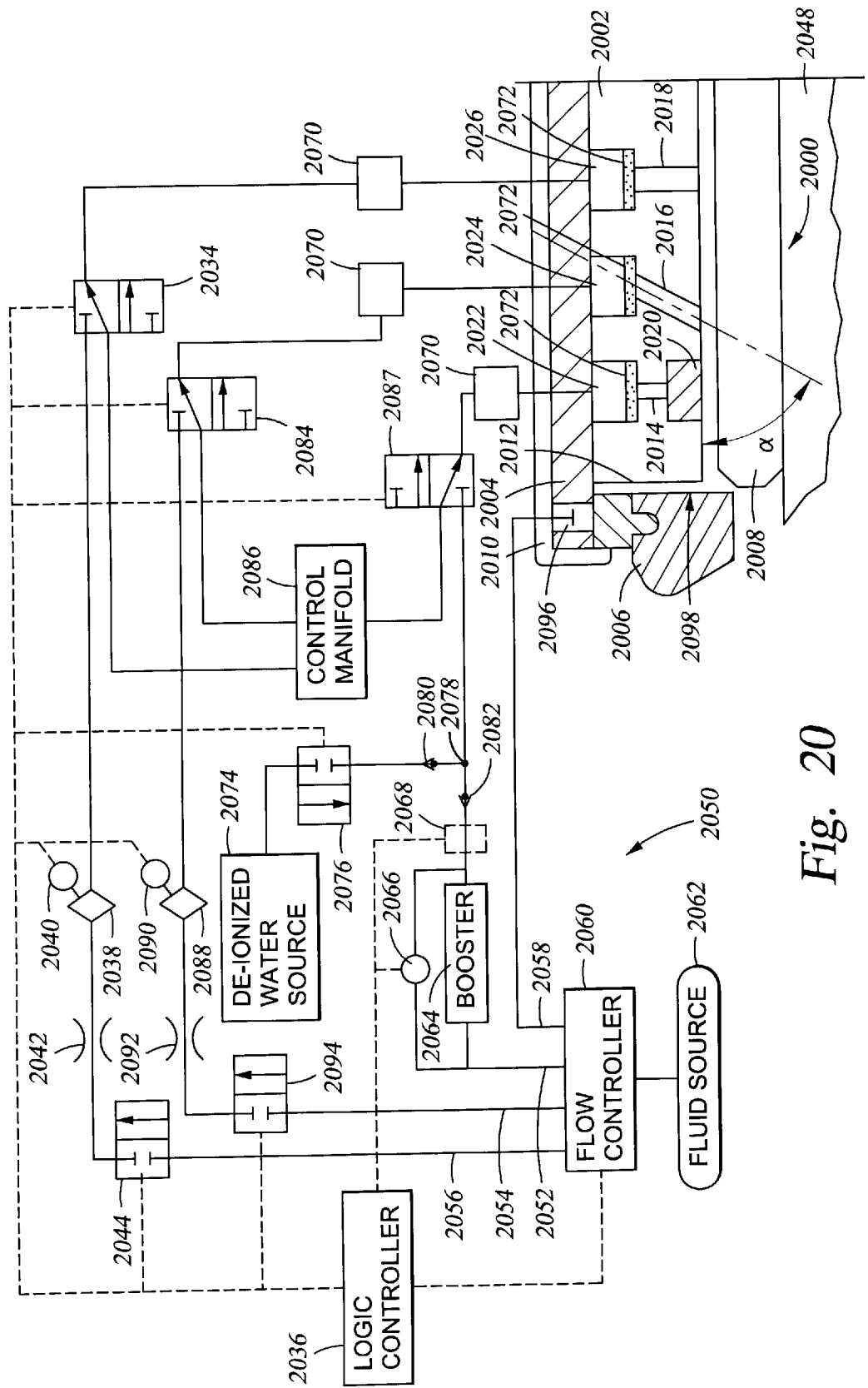
FIG. 20 is a partial cross-sectional view of one embodiment of a carrier.

FIG. 20 depicts one embodiment of a carrier 2000 coupled to a control circuit 2050. The carrier 2000 is substantially similar to the carrier 1900 described in reference to FIGS. 19A–D. The carrier 2000 generally includes a housing 2010, a body 2004, a retaining ring 2006 and a lower carrier plate 2002. The retaining ring 2006 circumscribes the body 2004 and prevents a substrate 2008 held by the carrier 2000 from moving out from under the carrier during polishing.

The lower carrier plate 2002 is disposed under the housing 2010. The lower carrier plate 2002 generally includes a plurality of ports for providing fluids between the carrier plate 2002 and the substrate 2008. In one embodiment, the carrier plate 2002 includes a first port 2014, a second port 2016 and a third port 2016. The first port 2014 is disposed near a perimeter 2012 of the lower carrier plate 2002 and is coupled to a first fluid circuit 2052 of the control circuits 2050. The first port 2014 may include one or more apertures, or a circular groove formed in the carrier plate 2002.

In one embodiment, a ring 2020 of microporous material, such as a metal, plastic or ceramic as described above, is disposed in the groove comprising the first port 2014. The porous ring 2020 may optionally include one or more holes disposed therethrough. The porous ring 2020 disperses fluid exiting the first port 2014 evenly about the lower carrier plate 2002. The fluid exiting the first port 2014 provides a fluid cushion that maintains the substrate 2008 in a spaced-apart relation to the lower plate 2002, thus substantially reducing damage (i.e., scratching) that may occur if the substrate were to contact the lower plate 2002 during polishing.

A first manifold 2022 is disposed in the body 2004. The first manifold 2022 is fluidly coupled to the first port 2014. The first manifold 2022 enhances flow uniformity through the first port 2014 by providing a plenum above the porous ring 2020, thus causing the fluid to distribute uniformly, thereover resulting in a uniform flow through the ring 2020.

The second port 2016 is generally disposed in the lower carrier plate 2002 radially inward of the first port 2014. The second port 2016 is coupled to a second fluid circuit 2054 of the control fluid circuit 2050. The second port 2016 may comprise at least one aperture disposed in carrier plate 2002, but may alternatively include additional apertures or a single groove. In one embodiment, the second port 2016 includes six apertures formed in the lower plate 2002.

The second port 2016 may optionally include a porous material disposed therein. The porous material is generally stoned or lapped co-planar the lower carrier plate 2002 to reduce the probability of substrate scratching.

The second port 2016 may be disposed at an angle cc to the centerline of the carrier 2000. The angle ax outwardly orientates the second port 2016 such that fluid exiting the second port 2016 is directed radially outwards, thus sweeping any particulate or other contamination that may be present proximate the lower plate 2002 or substrate 2008 towards the retaining ring 2006 and out from between the carrier 2000 and substrate 2008. In one embodiment, cc ranges between about 45 to 90 degrees.

Within the body 2004, the second port 2016 is fluidly coupled to a second manifold 2024. The second manifold 2024 distributes fluid provided by the second fluid circuit 2054 evenly around the apertures comprising the second port 2016 so that the fluid flowing through the second port 2016 is uniformly distributed.

The third port 2018 is disposed in the lower plate 2002 radially inward of the second port 2016. The third port 2018 is coupled to a third fluid circuit 2056 of the control fluid circuit 2050. The third port 2018 may comprise at least one aperture disposed in carrier plate, but may alternatively include additional apertures or a single groove.

The third port 2018 may optionally include a porous material disposed therein. The porous material is generally stoned or lapped co-planar the lower carrier plate 2018 to reduce the probability of substrate scratching.

Within the body 2004, the third port 2018 is fluidly coupled to a third manifold 2026. The third manifold 2026 distributes fluid provided by the third fluid circuit 2056 evenly around the apertures comprising the third port 2018 so that the fluid flowing through the third port 2018 is uniformly distributed.

A fourth fluid circuit 2058 is coupled to a cylinder. 2096 that controls the displacement of the retaining ring 2006 relative the carrier plate 2002.

The first fluid circuit 2052 is generally provides vacuum or fluid, for example clean, dry air (CDA), that flows through the porous ring 2020 and forms a layer of fluid between the lower carrier plate 2002 and the substrate 2008 retained in the carrier 2000. Alternatively, other fluids may be used in the first fluid circuit 2052 such as de-ionized water, ethylene glycol, soluble polishing fluid, nitrogen and the like. The fluid allows the substrate 2008 to be held by the carrier 2000 without contacting the lower carrier plate 2002, thus minimizing scratching of the substrate 2008 and particulate generation.

The first fluid circuit 2052 generally comprises a fluid source 2062, a flow controller 2060, a booster 2064 and a de-ionized water source 2074. The flow controller 2060 controls the flow rate of the fluid supplied from the source 2062 passing to the booster 2062. The flow controller 2060 generally includes one or more proportional flow control devices such as proportional valves, needle valves, regulators orifices or a combination thereof.

The booster 2062 generally provides a volumeric increase in the flow of fluid traveling in the first circuit 2052 between the booster 2062 and the first port 2014. The volumeric increase of flow from the booster 2062 generally corresponds to the rate of flow from the controller 2060 into the booster 2062.

A sensor 2066 monitors a flow metric (i.e., flow rate) between the booster 2062 and the first port 2014. Typically the sensor 2066 measures a pressure differential across the booster 2064 and provides a signal to a logic controller 2036, such as an industrial computer or programmable controller. The controller 2036, in response to the signal from the sensor 2066, adjusts the flow of fluid from the flow controller 2060 into the booster 2064 so that a predetermined rate of flow is provided to the first port 2014. Utilizing pressure differential across the booster 2064 provides fast response to flow variations, thus allowing the controller 2036 and flow controller 2060 to accurately control the flow provided to the first port 2014. Optionally, a sensor 2068, such as a mass flow rate sensor, may be utilized in between the booster 2064 and the first port 2014 to provide the flow metric for the first circuit 2052.

The de-ionized water source 2074 is coupled to the first circuit 2052 at a tee 2078 disposed between the booster 2064 and first port 2014. A shut-off valve 2076 is disposed between the water source 2074 and tee 2078. The shut-off valve 2076 controls the supply of de-ionized water to the ring 2020 disposed in the first port 2014. The de-ionized water prevents polishing fluids and other debris from entering and clogging the pores within the ring 2020 when the fluid from the supply 2062 is not flowing.

A first check valve 2080 is disposed between the tee 2078 and the shut-off valve 2076 to prevent air or other fluids within the first circuit 2052 from traveling towards the de-ionized water source 2074. A second check valve 2082 is disposed between the tee 2078 and the booster 2064 to prevent de-ionized water or other fluids within the first circuit 2052 from traveling towards the booster 2064 and flow controller 2060. The second check valve 2084 prevents liquids and other contaminants from disrupting the proper function of the flow controller 2060 and booster 2064.

Optionally, an in-line filter 2070 may be disposed between the tee 2078 and the first port 2014. The in-line filter 2070 generally comprises a filter having an appropriate flow and pressure rating and having a filtering capacity of at least 5 $\mu$m. In one embodiment, the filter 2070, such as those available from Pall Corporation, has a filtering capacity of 0.5 $\mu$m and removes micron sized particulates that may flow through the first port 2014 and deposit on or scratch the substrate 2008. Alternatively, a filter 2072, such as a flat sheet of filter media, may be disposed in the first manifold 2022 to prevent particulates from exiting the first port 2014. The filter 2070 and 2072 may also be utilized in the other fluid circuits 2054, 2056, 2058 comprising the control circuit 2050.

The control manifold 2086 may be optionally coupled to the first port 2014 by a valve 2087 disposed between the junction 2078 and the first port 2014. This configuration permits ambient air, fluids or vacuum provided from a control manifold 2086 to be coupled to the first port 2014.

The second fluid circuit 2054 and the third fluid circuit 2056 generally work in concert to provide a pressure gradient laterally across the substrate 2008 in the area between the substrate and the lower carrier plate 2002. The pressure gradient controls the local force that pushes the substrate 2008 against a polishing surface 2048, thus controlling polishing rate across the substrate's diameter. As depicted in Table 1, and illustrated in FIG. 21, pressure or vacuum may be applied to either the second circuit 2054 or the third circuit 2056 to provide a controllable force profile across the diameter of the substrate 2008.

The second fluid circuit 2054 is typically coupled to the second fluid port 2016. The second fluid circuit 2054 selectively couples the fluid source 2062 and the control manifold 2086 to the second fluid port 2016 via a three-way valve 2084. The fluid source 2062 is generally coupled to the normally open side of the valve 2084 and the control manifold 2086 is generally coupled to the normally closed side the valve 2084. Alternatively, the fluid source 2062 and the control manifold 2086 may be switched between the normally open and normally closed ports of the three-way valve 2084 with a corresponding adjustment in the control circuit logic.

Generally, the second fluid circuit 2016 includes a shut-off valve 2094 disposed proximate the flow controller 2060, an orifice 2092 and a coalescing filter 2088. The orifice 2042 is typically disposed between the coalescing filter 2088 and the valve 2094. The orifice 2092 generally provides a restriction that converts the flow control provided to the second circuit 2054 by the flow controller 2060 to pressure control at the second port 2016. The orifice 2092 may be a fixed restrictor, a needle valve or the like. Alternatively, the orifice 2092 may be positioned within the carrier 2000 or at the second fluid port 2016.

The coalescing filter 2088 is generally positioned between the orifice 2092 and the second fluid port 2016. The coalescing filter 2092 separates fluid, such as de-ionized water, that may be trapped in the second circuit 2054 from moving towards the flow controller 2060. By preventing fluid from reaching the flow controller 2060, the flow controller 2060 is protected from damage, such as corrosion or water deposits, thus extending the life and enhancing the performance of the flow controller 2060.

The coalescing filter 2088 may additionally include pressure taps disposed thereon. A pressure sensor 2090 may be coupled the pressure taps to monitor pressure at the second port 2016. When the shut-off valve 2094 is closed and the three-way valve 2034 is open, the coalescing filter 2038 is in fluid communication with the space between the substrate 2008 and the lower carrier plate 2002. In such a configuration, the pressure sensor 2090 will indicate the pressure upon the substrate 2008 beneath the second port 2016.

In one mode of operation, the second fluid circuit 2054 couples the fluid source 2062 through the flow controller 2060 to the second port 2016. In this mode, a fluid, such as nitrogen, CDA or the like, is provided through the port 2016. In another mode of operation, the control manifold 2086 is coupled to the second port 2016. In this mode, the control manifold 2086 generally provides de-ionized water or other liquid, vacuum, gas or ambient pressure (i.e., vents) through the second fluid port 2016. Generally, de-ionized water is provided to maintain the port 2016 free from debris or polishing fluid that may dry therein. During chucking of the substrate 2008 with the carrier 2000, vacuum is generally applied to retain the substrate 2008 to the carrier 2000 during transfer.

The third fluid circuit 2056 is typically coupled to the third fluid port 2018. The third fluid circuit 2056 selectively couples the fluid source 2062 and a control manifold 2086 to the third fluid port 2018 via a three-way valve 2034. The fluid source 2062 is generally coupled to the normally open side of the valve 2034 and the control manifold 2086 is generally coupled to the normally closed side the valve 2034. Alternatively, the fluid source 2062 and the control manifold 2086 may be switched between the normally open and normally closed ports of the three-way valve 2034 with a corresponding adjustment in the control circuit logic.

Generally, the third fluid circuit 2056 includes a shut-off valve 2044 disposed proximate the flow controller 2060, an orifice 2042 and a coalescing filter 2038. The orifice 2042 is typically disposed between the coalescing filter 2038 and the valve 2044. The orifice 2042 generally provides a restriction that converts the flow control provided to the second circuit 2054 by the flow controller 2060 to pressure control at the third port 2018. The orifice 2042 is generally configured similar to the orifice 2092 of the second fluid circuit 2054.

The coalescing filter 2038 is generally positioned between the orifice 2042 and the third fluid port 2018. The coalescing filter 2042 separates fluid, such as de-ionized water, that may be trapped in the third circuit 2056 from moving towards the flow controller 2060.

The coalescing filter 2038 may additionally include pressure taps disposed thereon. A pressure sensor 2040 may be coupled the pressure taps to monitor pressure at the third port 2018. When the shut-off valve 2044 is closed and the three-way valve 2034 is open, the coalescing filter 2038 is in fluid communication with the space between the substrate 2008 and the lower carrier plate 2002. In such a configuration, the pressure sensor 2040 will indicate the pressure upon the substrate 2008 beneath the third port 2018. Coupled with pressure information provided by the sensor 2090 of the second fluid circuit 2054, the force gradient across the substrate's face may be determined.

In one mode of operation, the third fluid circuit 2056 couples the fluid source 2062 through the flow controller 2060 to the third port 2018. In this mode, a fluid, such as nitrogen, CDA or the like, is provided through the port 2016. In another mode of operation, the control manifold 2086 is coupled to the third port 2018. In this mode, the control manifold 2086 generally provides de-ionized water or other liquid, vacuum, gas or ambient pressure (i.e., vents) through the third fluid port 2018. The modes of operation between the second fluid circuit 2054 and the third circuit 2056 may be controlled to operate together or independent of one another.

Optionally a filter may be positioned in one or both of the second and third fluid circuit legs 2054, 2056. For example, the filter may be similar to the inline filter 2070 or the sheet filter 2072 utilized in the first fluid circuit 2052.

Alternatively, the filters may be disposed in the ports 2016 and 2018 as depicted in FIG. 20. Generally, one or both of the first or second ports 2016 and 2018 include a counter bore 2102 typically concentric with the one or more apertures comprising the ports 2016 and 2018. A filter material 2104 is disposed within the counter bore 2102. Typically, the filter material 2104 is a porous metal, polymer or ceramic. The material 2104 is finished to be co-planar to the lower carrier plate 2002. The finishing process may include lapping, stoning, grinding, polishing, electropolishing or a combination thereof. The filter material 2104 may be selected to additionally function as the orifice (2038, 2088) of the respective control circuit.

The control circuit 2050 may additionally include a fourth circuit 2058 for controlling the elevation of the retaining ring 2006 relative the carrier plate 2002. Generally, the fourth control circuit 2058 couples one or more cylinders 2092 to the fluid source 2062 and the flow controller 2060.

The control circuit 2050 thus selectively provides fluids and vacuum to the various ports 2014, 2016 and 2018. The flexibility of the control circuit 2050 that provides different modes of operation between the fluid circuits 2052, 2054 and 2056 results in enhanced control of the forces applied to the substrate 2008 during polishing. Additionally, the fluid disposed by the circuit 2050 between the substrate and the carrier plate 2002 that minimizes the probability of damage to the substrate 2008.

The features of the carrier described herein that deal with the specifics of a given construction are not for the purposes of limitation, but instead for the purposes of illustration and example. For example, it will be appreciated by those skilled in the art that certain aspects of this invention may be readily practiced on systems that do not have a gimbal assembly and different quantities of fluid circuits, ports, and rings. It is intended that this application include these and other such modifications that would be apparent to one of ordinary skill in the art upon reading this description of the present invention. Accordingly, the scope of the present invention may be ascertained only by reference to the appended claims.

While foregoing is directed to a preferred embodiment of the present invention, other and further embodiments of the invention may be devised without departing from the basic scope thereof, and the scope thereof is determined by the claims that follow.

What is claimed is:

1. A method for retaining a substrate comprising the steps of:

disposing the substrate adjacent a carrier plate;

flowing a first fluid through a first port disposed on the carrier plate into a plenum at least partially bounded between the substrate and the carrier plate; and applying at least one of a second fluid or vacuum through a second port disposed on the carrier plate into the plenum between the substrate and the carrier plate.

2. The method of claim 1 further comprising the step of venting the flow between the carrier plate and the substrate.

3. The method of claim 1 further comprising the step of applying a force to the carrier plate that causes the substrate to engage a polishing media.

4. The method of claim 1 further comprising the step of applying a third fluid or vacuum through a third port disposed on the earner plate between the substrate and the carrier plate.

5. The method of claim 4, wherein the steps of applying the second fluid or vacuum through the second port and applying the third fluid or vacuum through the third port are separately controllable.

6. The method of claim 4, wherein air is applied to the first and second ports, and vacuum is applied to the third port.

7. The method of claim 4, wherein air is applied to the first and third ports, and vacuum is applied to the second port.

8. The method of claim 4, wherein air is applied to the first ports, and a fluid is applied to at least one of the second or the third ports.

9. The method of claim 8, wherein the fluid is ambient air, nitrogen, soluble polishing fluid, de-ionized water or clean dry air.

10. The method of claim 8, wherein the fluid is a combination of de-ionized water and ambient air, nitrogen, soluble polishing fluid or clean dry air.

11. A method for retaining a substrate comprising the steps of:

disposing the substrate adjacent a carrier plate;

flowing a first fluid from a first fluid circuit through a first port disposed adjacent a perimeter of the carrier plate to a space at least partially bounded by the substrate and the carrier plate;

coupling a second fluid circuit to the space between the substrate and the carrier plate through a second port disposed on the carrier plate inward of the first port; and coupling a third fluid circuit to the space between the substrate and the carrier plate through a third port disposed inward of the second port.

12. The method of claim 11 further comprising the steps of:

having no flow through the second port; and having no flow through the third port.

13. The method of claim 11 further comprising the steps of:

flowing a fluid into the space through the second port; and having no flow through the third port.

14. The method of claim 11 further comprising the steps of:

flowing a fluid from the space through the second port; and having no flow through the third port.

15. The method of claim 11 further comprising the steps of:

having no flow through the second port; and flowing a fluid to the space through the third port.

16. The method of claim 11 further comprising the steps of:

having no flow through the second port; and flowing a fluid from the space through the third port.

17. The method of claim 11 further comprising the steps of: flowing a first fluid to the space through the second port; and flowing a second fluid to the space through the third port.

18. The method of claim 11 further comprising the steps of:

flowing a first fluid to the space through the second port; and flowing a second fluid from the space through the third port.

19. The method of claim 11 further comprising the steps of:

flowing a first fluid from the space through the second port; and flowing a second fluid from the space through the third port.

* * * * *

UNITED STATES PATENT AND TRADEMARK OFFICE
CERTIFICATE OF CORRECTION

PATENT NO.   : 6,645,050 B1
DATED        : November 11, 2003
INVENTOR(S)  : Butterfield et al.

It is certified that error appears in the above-identified patent and that said Letters Patent is hereby corrected as shown below:

Column 3,
Line 43, please change "plate 110" to -- plate 1110 --.

Column 6,
Line 23, please change "10 _m" to -- 10 $\mu$m --.

Column 9,
Line 52, please change "ore" to -- more --.

Column 16,
Line 38, please change "fluidicly" to -- fluidly --.

Column 17,
Line 46, please change "fluidicly" to -- fluidly --.

Column 19,
Lines 59 and 66, please change "cc" to -- $\alpha$ --.
Line 60, please change "ax" to -- $\alpha$ --.

Signed and Sealed this

First Day of June, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,645,050 B1
DATED : November 11, 2003
INVENTOR(S) : Paul D. Butterfield et al.

It is certified that error appears in the above-identified patent and that said Letters Patent is hereby corrected as shown below:

Column 18,
Line 53, change "Fig. 21" to -- Fig. 22 --.

Signed and Sealed this

Fifteenth Day of February, 2005

JON W. DUDAS
*Director of the United States Patent and Trademark Office*